United States Patent
Hatano

(10) Patent No.: US 12,046,549 B2
(45) Date of Patent: Jul. 23, 2024

(54) SEMICONDUCTOR DEVICE

(71) Applicant: ROHM CO., LTD., Kyoto (JP)

(72) Inventor: Maiko Hatano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 358 days.

(21) Appl. No.: 17/765,756

(22) PCT Filed: Oct. 21, 2020

(86) PCT No.: PCT/JP2020/039584
§ 371 (c)(1),
(2) Date: Mar. 31, 2022

(87) PCT Pub. No.: WO2021/079913
PCT Pub. Date: Apr. 29, 2021

(65) Prior Publication Data
US 2022/0344253 A1  Oct. 27, 2022

(30) Foreign Application Priority Data

Oct. 24, 2019 (JP) ................................. 2019-193437

(51) Int. Cl.
*H01L 23/498* (2006.01)
*H01L 23/00* (2006.01)
(Continued)

(52) U.S. Cl.
CPC ...... *H01L 23/49844* (2013.01); *H01L 23/145* (2013.01); *H01L 23/49811* (2013.01);
(Continued)

(58) Field of Classification Search
None
See application file for complete search history.

(56) References Cited

U.S. PATENT DOCUMENTS

| 2012/0091572 A1* | 4/2012 | Hamaguchi | H01L 23/13 257/676 |
| 2018/0145007 A1* | 5/2018 | Hatano | H01L 25/115 |
| 2021/0398881 A1* | 12/2021 | Hatano | H01L 23/3114 |

FOREIGN PATENT DOCUMENTS

| JP | 2010-153639 A | 7/2010 |
| JP | 2015-220382 A | 12/2015 |

(Continued)

OTHER PUBLICATIONS

International Search Report issued in PCT/JP2020/039584, Dec. 28, 2020 (2 pages).

*Primary Examiner* — Nishath Yasmeen
(74) *Attorney, Agent, or Firm* — HSML P.C.

(57) ABSTRACT

A semiconductor device includes an insulating substrate, a first and a second obverse-surface metal layers disposed on an obverse surface of the insulating substrate, a first and a second reverse-surface metal layers disposed on a reverse surface of the insulating substrate, a first conductive layer and a first semiconductor element disposed on the first obverse-surface metal layer, and a second conductive layer and a second semiconductor element disposed on the second obverse-surface metal layer. Each of the first conductive layer and the second conductive layer has an anisotropic coefficient of linear expansion and is arranged such that the direction in which the coefficient of linear expansion is relatively large is along a predetermined direction perpendicular to the thickness direction of the insulating substrate. The first and second reverse-surface metal layers are smaller than the first and second obverse-surface metal layers in dimension in the predetermined direction.

18 Claims, 22 Drawing Sheets

(51) Int. Cl.
*H01L 23/14* (2006.01)
*H01L 25/07* (2006.01)

(52) U.S. Cl.
CPC .. *H01L 23/49822* (2013.01); *H01L 23/49833* (2013.01); *H01L 23/49861* (2013.01); *H01L 23/49866* (2013.01); *H01L 24/32* (2013.01); *H01L 24/40* (2013.01); *H01L 24/48* (2013.01); *H01L 24/73* (2013.01); *H01L 25/072* (2013.01); *H01L 24/16* (2013.01); *H01L 2224/16245* (2013.01); *H01L 2224/32225* (2013.01); *H01L 2224/4001* (2013.01); *H01L 2224/40095* (2013.01); *H01L 2224/40177* (2013.01); *H01L 2224/40225* (2013.01); *H01L 2224/48225* (2013.01); *H01L 2224/73207* (2013.01); *H01L 2224/73221* (2013.01); *H01L 2224/73253* (2013.01); *H01L 2224/73263* (2013.01); *H01L 2224/73265* (2013.01); *H01L 2924/10272* (2013.01); *H01L 2924/13091* (2013.01); *H01L 2924/1815* (2013.01); *H01L 2924/182* (2013.01); *H01L 2924/3511* (2013.01)

(56) References Cited

FOREIGN PATENT DOCUMENTS

| | | |
|---|---|---|
| JP | 2016-115810 A | 6/2016 |
| JP | 2018-74089 A | 5/2018 |
| JP | 2019-71399 A | 5/2019 |
| WO | 2010/150297 A1 | 12/2010 |

\* cited by examiner

SEMICONDUCTOR DEVICE

TECHNICAL FIELD

The present disclosure relates to a semiconductor device.

BACKGROUND ART

An example of a conventional semiconductor device (power module) is disclosed in Patent Document 1. The semiconductor device includes a semiconductor element, a supporting substrate (ceramic substrate), and a heat dissipating member. The supporting substrate supports the semiconductor element 1. The supporting substrate includes an insulating base, and conductor layers, which are made of copper, laminated on the respective surfaces of the base. The semiconductor element is bonded to one of the conductor layers, while the heat dissipating member is bonded to the other one of the conductor layers.

In recent years, semiconductor devices having semiconductor elements are required to have improved heat dissipation efficiency (reduced thermal resistance). For example, as disclosed in Patent Document 2, a member called heat spreader may be disposed between the semiconductor element and the supporting substrate in the thickness direction of the semiconductor device. A heat spreader is a heat dissipating plate that dissipates the heat generated by the semiconductor element. Copper and aluminum are generally used as the material for heat spreaders, but graphite, which has a higher thermal conductivity than copper and aluminum, has been attracting attention. While the thermal conductivity of copper is about 398 W/mK and that of aluminum is about 236 W/mK, the thermal conductivity of graphite is about 1500 W/mK.

TECHNICAL REFERENCE

Patent Document

Patent Document 1: JP-A-2015-220382
Patent Document 2: JP-A-2010-153639

SUMMARY OF THE INVENTION

Problems to be Solved by the Invention

Graphite has a hexagonal crystal structure and multiple layers, having a relatively high thermal conductivity in the direction parallel to the plane of the layers and a relatively low thermal conductivity in the direction perpendicular to the layers. For example, the thermal conductivity in the direction parallel to the layer(s) is about 1500 W/mK, whereas the thermal conductivity in the direction perpendicular to the layer is about 5 W/mK. That is, graphite has anisotropic thermal conductivity. Thus, arrangement is made such that the direction parallel to the layer corresponds to the direction in which heat is conducted. In conventional semiconductor devices, the direction in which heat is conducted is the direction from the semiconductor element toward the supporting substrate (i.e., the thickness direction).

Graphite also has anisotropic coefficient of linear expansion, and the coefficient of linear expansion in the direction perpendicular to the layer is larger than the coefficient of linear expansion in the direction parallel to the layer. For example, the coefficient of linear expansion in the direction perpendicular to the layer is about 25 ppm/K, whereas the coefficient of linear expansion in the direction parallel to the layer is about 0 ppm/K. As seen from this, the coefficient of linear expansion may vary depending on the planes perpendicular to the thickness direction, which may lead to warpage of the supporting substrate. Such warpage of the supporting substrate can occur due to the heat cycle during the manufacture or operation of the semiconductor device. The warpage of the supporting substrate may cause a bonding failure or a conduction failure between the parts of the semiconductor device and may hence deteriorate the reliability of the semiconductor device.

The present disclosure has been proposed under the above-noted circumstances, and an object of the present disclosure is to provide a semiconductor device capable of preventing the warpage of the supporting substrate even when its material has anisotropic coefficient of linear expansion.

Means for Solving the Problems

A semiconductor device provided according to a first aspect of the present disclosure includes an insulating substrate having a first obverse surface and a first reverse surface spaced apart from each other in a first direction, a first obverse-surface metal layer and a second obverse-surface metal layer disposed on the first obverse surface and spaced apart from each other, a first reverse-surface metal layer and a second reverse-surface metal layer disposed on the first reverse surface and spaced apart from each other, a first conductive layer disposed on the first obverse-surface metal layer, a second conductive layer disposed on the second obverse-surface metal layer, a first semiconductor element disposed on the first conductive layer and electrically connected to the first conductive layer, and a second semiconductor element disposed on the second conductive layer and electrically connected to the second conductive layer. The first obverse-surface metal layer and the first reverse-surface metal layer overlap with each other as viewed in the first direction, and the second obverse-surface metal layer and the second reverse-surface metal layer overlap with each other as viewed in the first direction. The first obverse-surface metal layer and the second obverse-surface metal layer are arranged side by side in a second direction perpendicular to the first direction. Each of the first conductive layer and the second conductive layer has an anisotropic coefficient of linear expansion and is arranged such that a direction in which the coefficient of linear expansion is relatively large is along a third direction perpendicular to the first direction and the second direction. Dimensions of the first reverse-surface metal layer and the second reverse-surface metal layer in the third direction are smaller than dimensions of the first obverse-surface metal layer and the second obverse-surface metal layer in the third direction, respectively.

A semiconductor device provided according to a second aspect of the present disclosure includes an insulating substrate having a first obverse surface and a first reverse surface spaced apart from each other in a first direction, a first obverse-surface metal layer and a second obverse-surface metal layer disposed on the first obverse surface and spaced apart from each other, a reverse-surface metal layer disposed on the first reverse surface, a first conductive layer disposed on the first obverse-surface metal layer, a second conductive layer disposed on the second obverse-surface metal layer, a first semiconductor element disposed on the first conductive layer and electrically connected to the first conductive layer, and a second semiconductor element disposed on the second conductive layer and electrically connected to the second conductive layer. The first obverse-surface metal layer and the second obverse-surface metal layer are arranged side by side in a second direction perpendicular to the first direction and each overlapping with the reverse-surface metal layer as viewed in the first direction. Each of the first conductive layer and the second conductive layer has an anisotropic coefficient of linear expansion and is arranged such that a direction in which the coefficient of linear expansion is relatively large is along a third direction perpendicular to the first direction and the second direction. The insulating substrate is made of a resin material having an anisotropic coefficient of linear expansion and is arranged such that a direction in which the coefficient of linear expansion is relatively large is along the third direction.

A semiconductor device provided according to a third aspect of the present disclosure includes a first insulating substrate having a first obverse surface and a first reverse surface spaced apart from each other in a first direction, a second insulating substrate having a second obverse surface and a second reverse surface spaced apart from each other in the first direction, a first obverse-surface metal layer disposed on the first obverse surface, a second obverse-surface metal layer disposed on the second obverse surface, a first reverse-surface metal layer disposed on the first reverse surface, a second reverse-surface metal layer disposed on the second reverse surface, a first conductive layer disposed on the first obverse-surface metal layer, a second conductive layer disposed on the second obverse-surface metal layer, a first semiconductor element disposed on the first conductive layer and electrically connected to the first conductive layer, and a second semiconductor element disposed on the second conductive layer and electrically connected to the second conductive layer. The first insulating substrate and the second insulating substrate are arranged side by side and spaced apart from each other in a second direction perpendicular to the first direction. The first obverse-surface metal layer and the first reverse-surface metal layer overlap with each other as viewed in the first direction. The second obverse-surface metal layer and the second reverse-surface metal layer overlap with each other as viewed in the first direction. Each of the first conductive layer and the second conductive layer has an anisotropic coefficient of linear expansion and is arranged such that the direction in which the coefficient of linear expansion is relatively large is along a third direction perpendicular to the first direction and the second direction. Each of the first insulating substrate and the second insulating substrate is made of a resin material having a Young's modulus of 50 GPa or less.

Advantages of the Invention

The semiconductor device according to the present invention can reduce the warpage of the supporting substrate even when its material has anisotropic coefficient of linear expansion, and hence, the reliability of the semiconductor device is improved.

MODE FOR CARRYING OUT THE INVENTION

Figure 1:
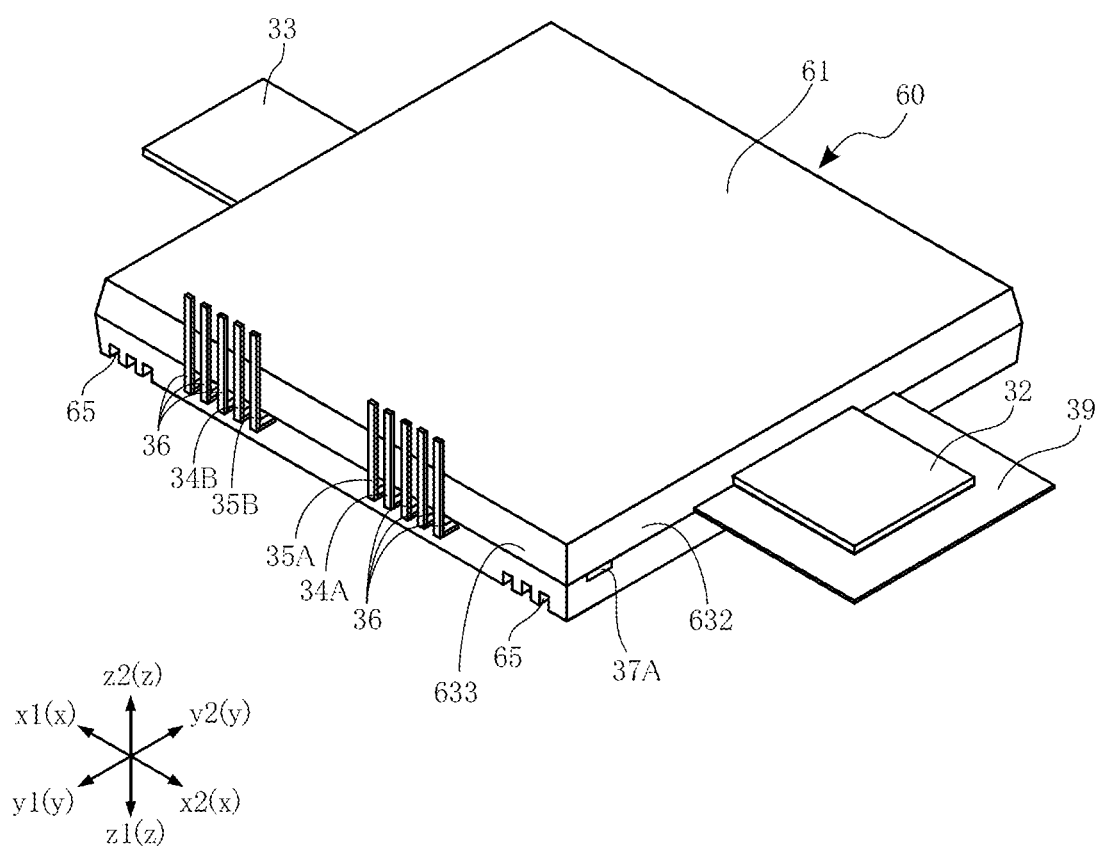
FIG. 1 is a perspective view of a semiconductor device according to a first embodiment.

A semiconductor device and a method for manufacturing a semiconductor device according to the present disclosure are described below with reference to the accompanying drawings. Hereinafter, the elements that are identical or similar to each other are denoted by the same reference signs, and the description thereof is omitted.

In the present disclosure, the phrases "an object A is formed in an object B" and "an object A is formed on an object B" include, unless otherwise specified, "an object A is formed directly in/on an object B" and "an object A is formed in/on an object B with another object interposed between the object A and the object B". Similarly, the phrases "an object A is disposed in an object B" and "an object A is disposed on an object B" include, unless otherwise specified, "an object A is disposed directly in/on an object B" and "an object A is disposed in/on an object B with another object interposed between the object A and the object B". Similarly, the phrase "an object A is located on an object B" includes, unless otherwise specified, "an object A is located on an object B in contact with the object B" and "an object A is located on an object B with another object interposed between the object A and the object B". Also, the phrase "an object A overlaps with an object B as viewed in a certain direction" includes, unless otherwise specified, "the object A overlaps with the entirety of the object B" and "the object A overlaps with a portion of the object B".

FIGS. 1 to 15 show a semiconductor device according to a first embodiment of the present disclosure. The illustrated semiconductor device A1 includes a plurality of semiconductor elements 10, a supporting substrate 20, two input terminals 31 and 32, an output terminal 33, a pair of gate terminals 34A and 34B, a pair of detection terminals 35A and 35B, a plurality of dummy terminals 36, a pair of side terminals 37A and 37B, a plurality of base parts 41, a plurality of cord-like connecting members 51, a plurality of plate-like connecting members 52, and a sealing member 60.

Figure 2:
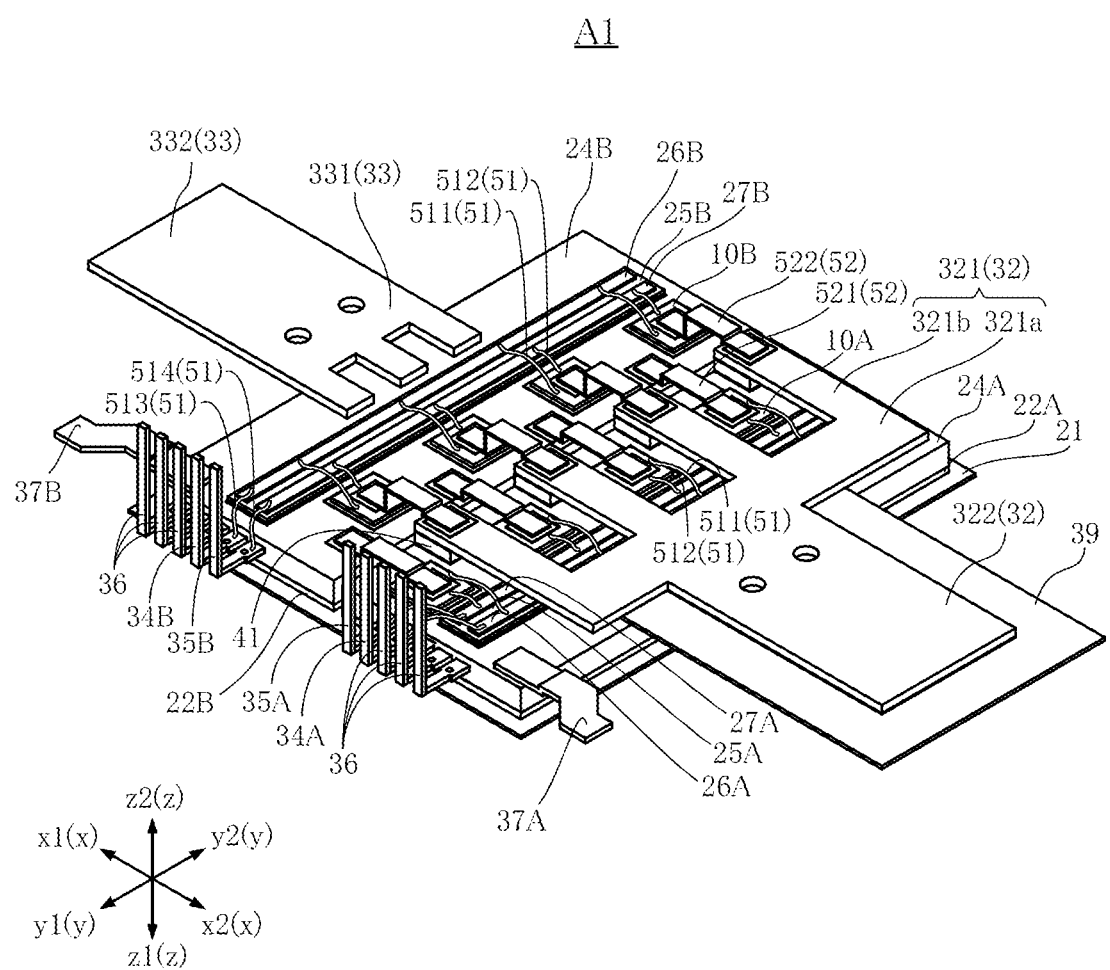
FIG. 2 is a perspective view corresponding to FIG. 1, with a sealing member omitted.
Figure 3:
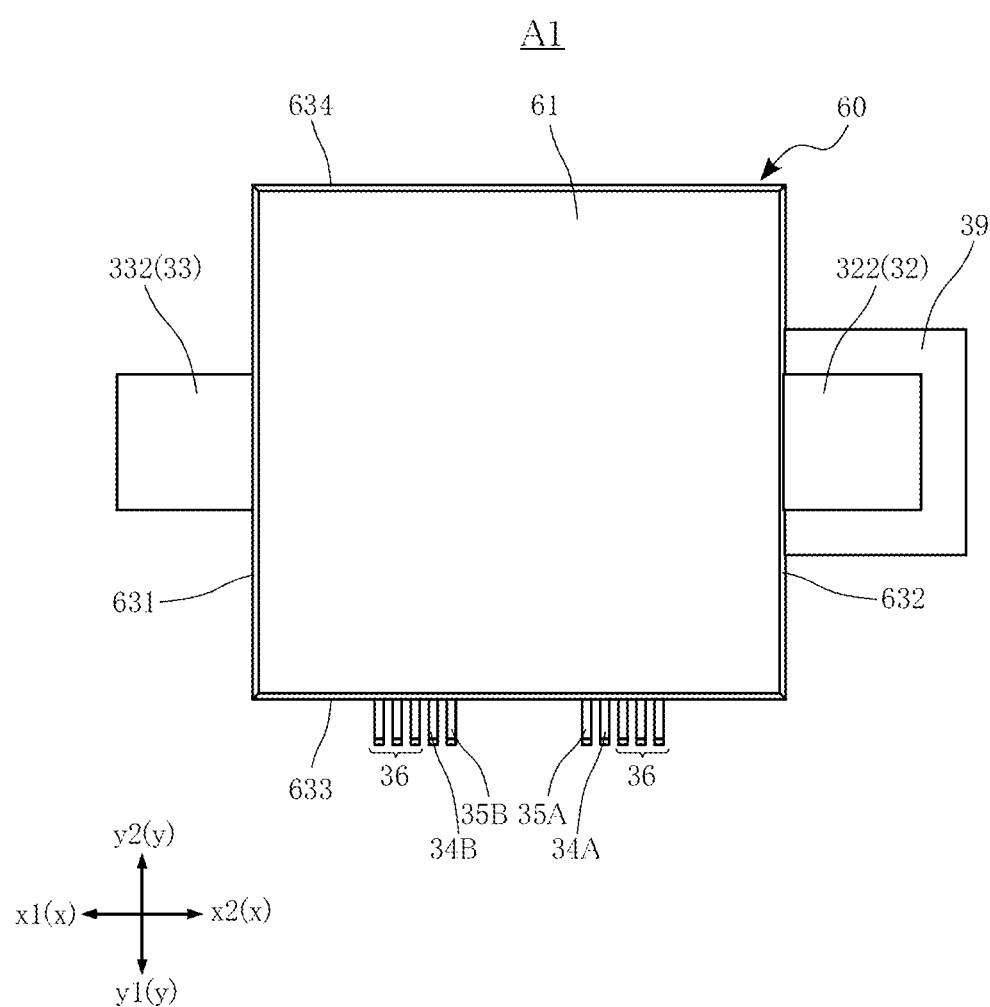
FIG. 3 is a plan view of the semiconductor device according to the first embodiment.
Figure 4:
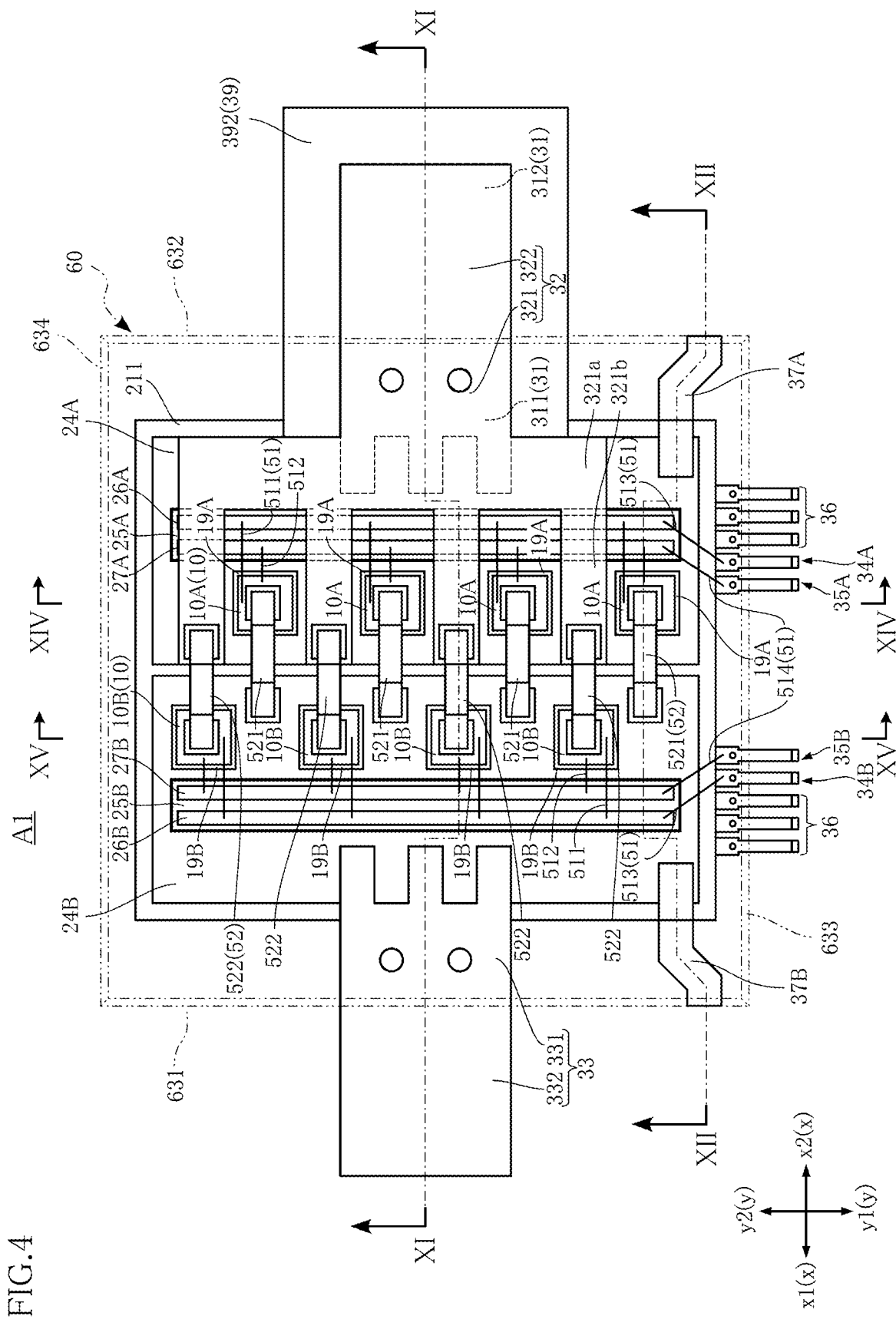
FIG. 4 is a plan view corresponding to FIG. 2, with the sealing member omitted.
Figure 5:
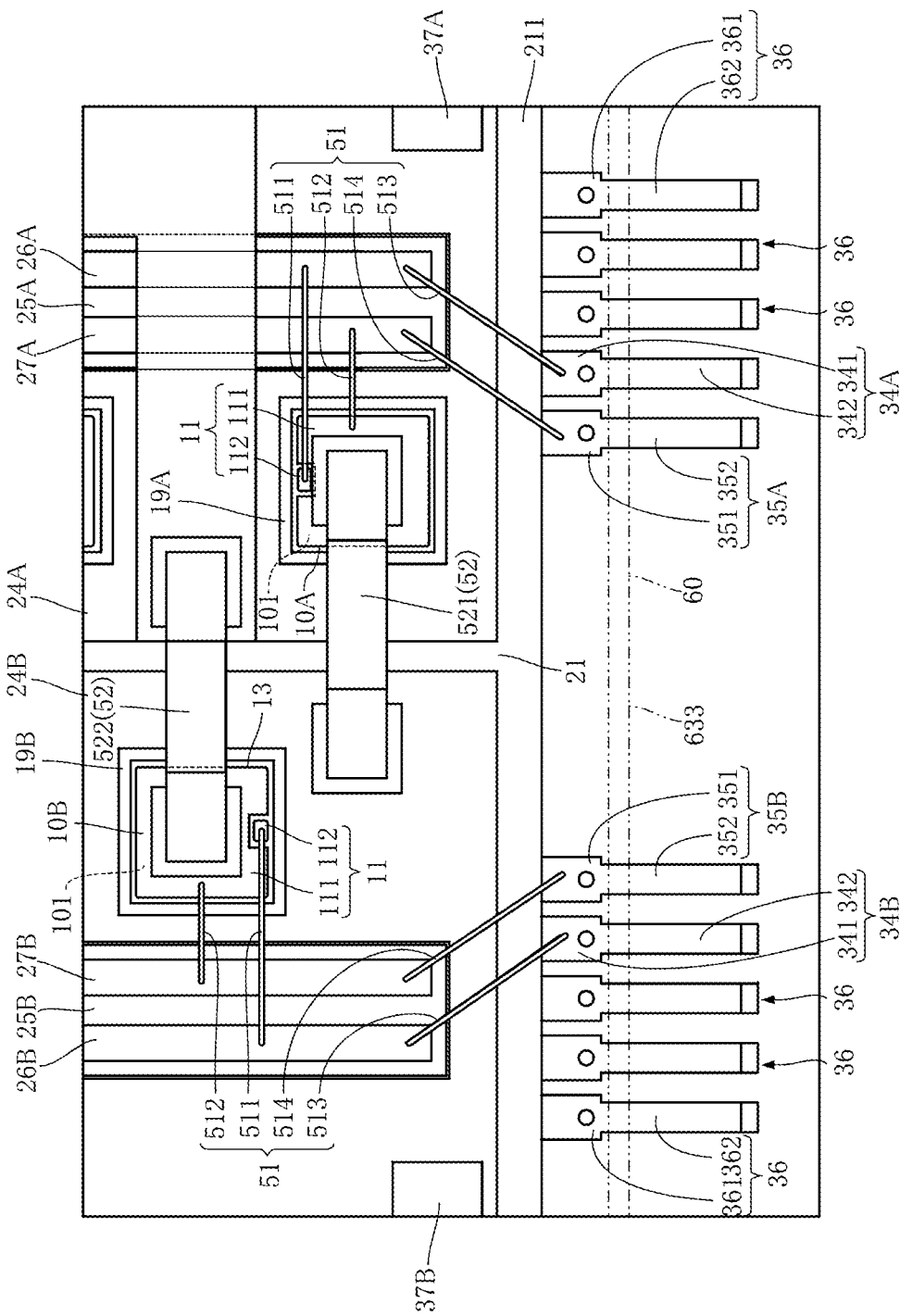
FIG. 5 is an enlarged view showing a part of FIG. 4.
Figure 6:
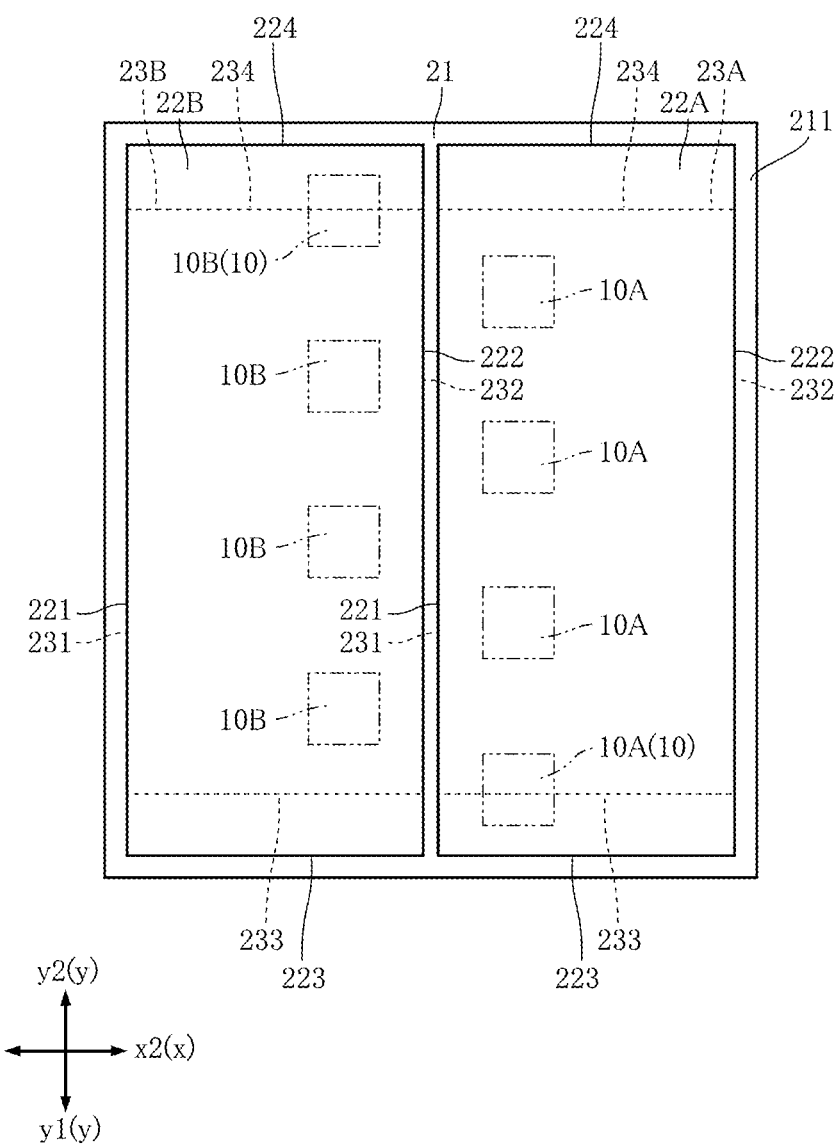
FIG. 6 is a view showing parts extracted from FIG. 4.
Figure 7:
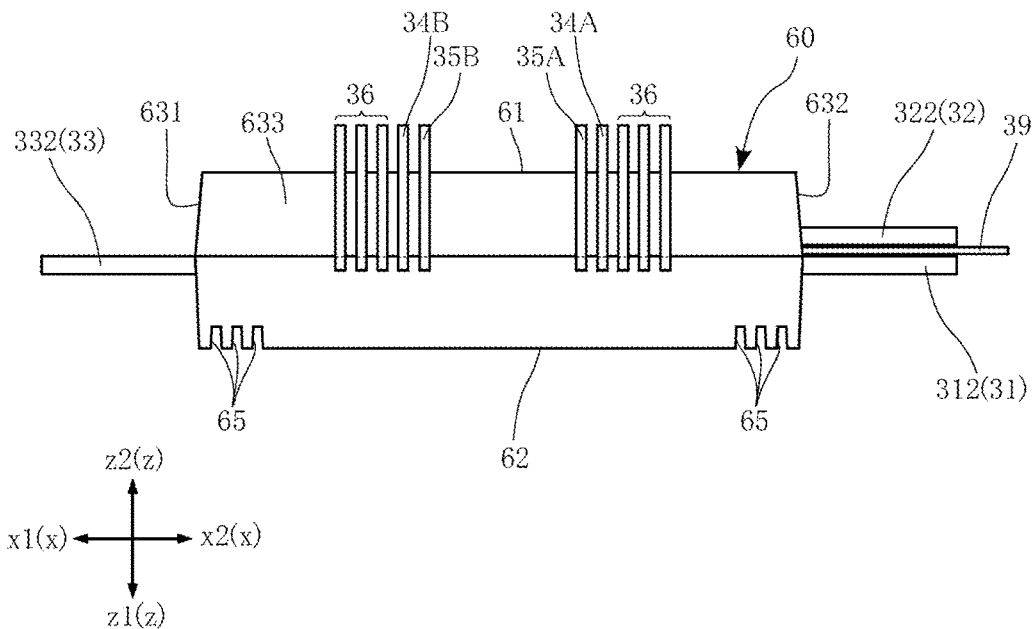
FIG. 7 is a front view of the semiconductor device according to the first embodiment.
Figure 8:
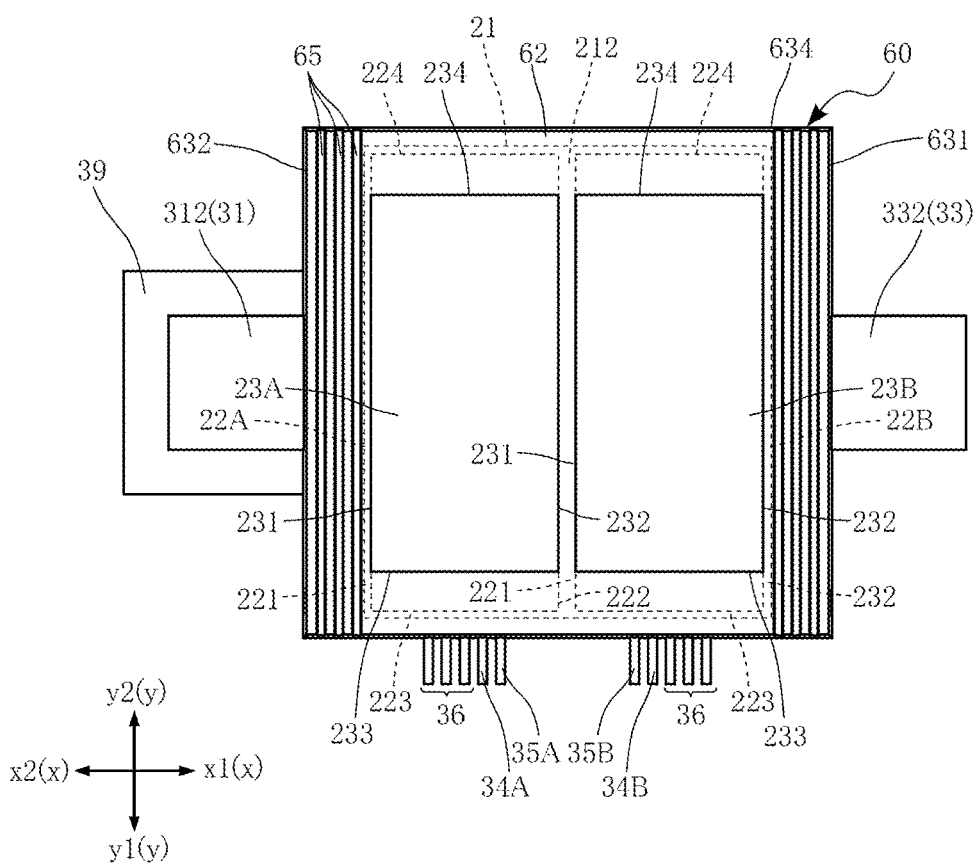
FIG. 8 is a bottom view of the semiconductor device according to the first embodiment.
Figure 9:
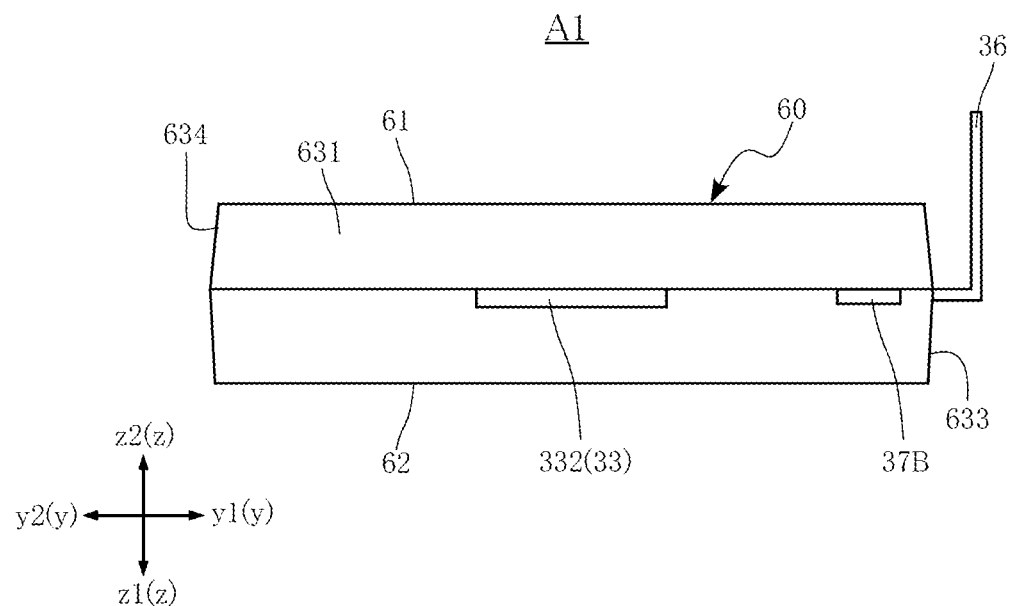
FIG. 9 is a left side view of the semiconductor device according to the first embodiment.
Figure 10:
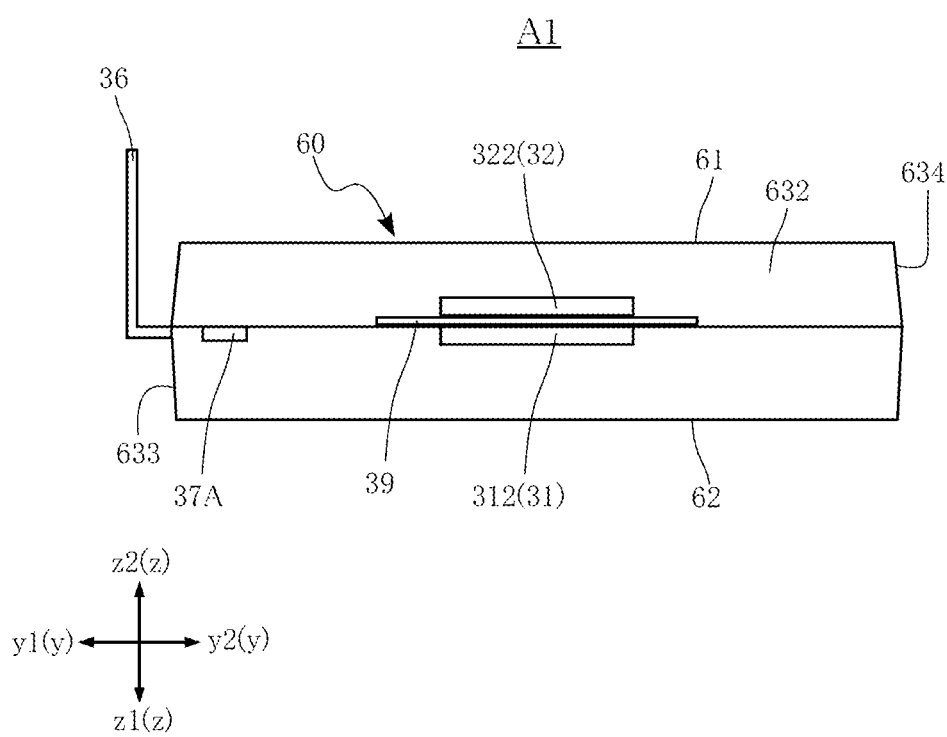
FIG. 10 is a right side view of the semiconductor device according to the first embodiment.
Figure 11:
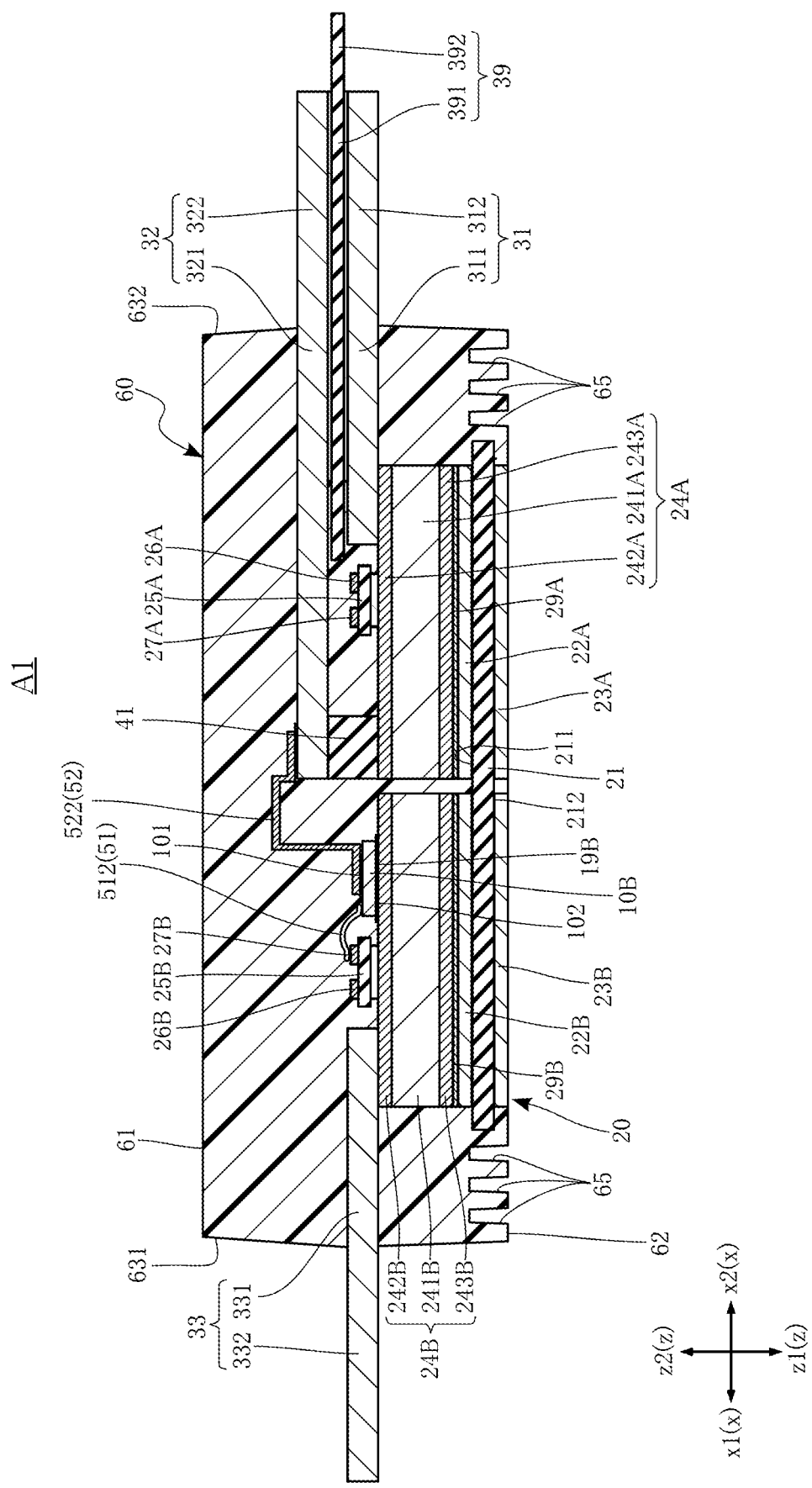
FIG. 11 is a sectional view taken along line XI-XI in FIG. 4.
Figure 12:
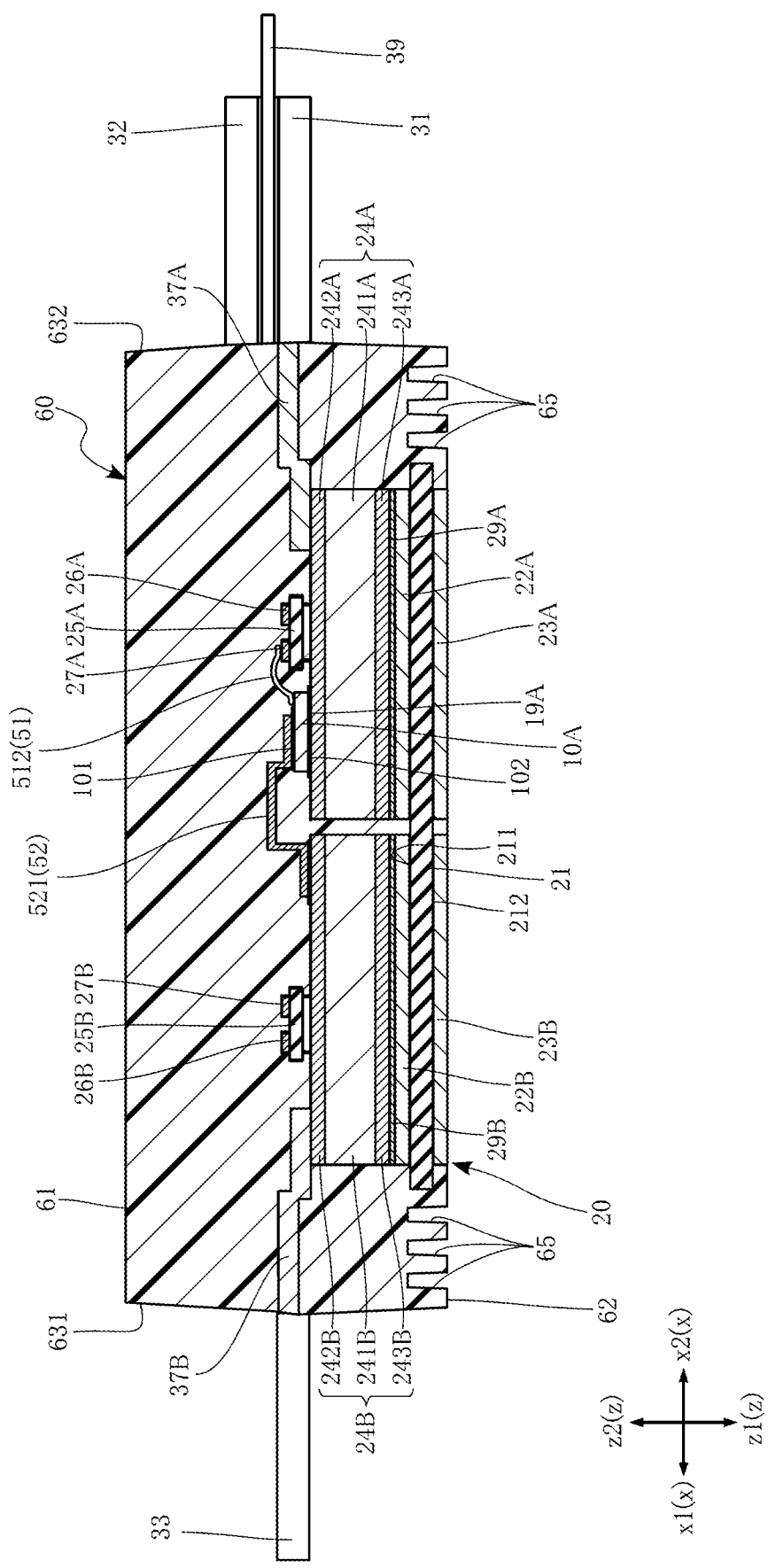
FIG. 12 is a sectional view taken along line XII-XII in FIG. 4.
Figure 13:
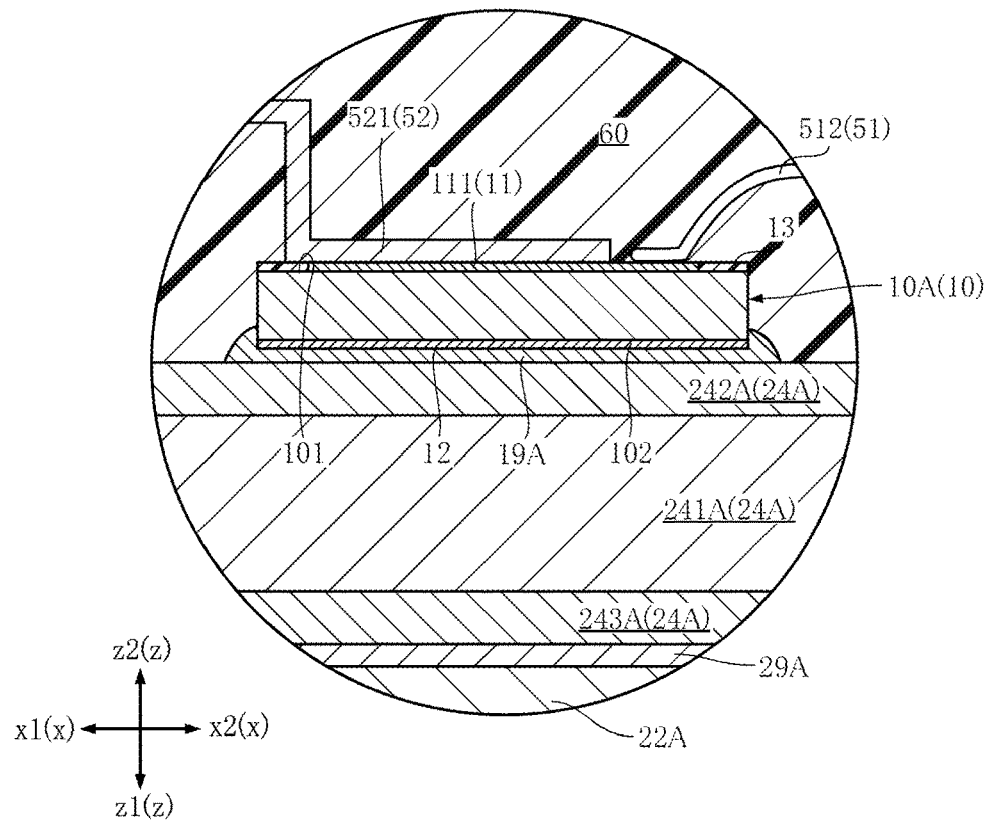
FIG. 13 is an enlarged view showing a part of FIG. 12.
Figure 14:
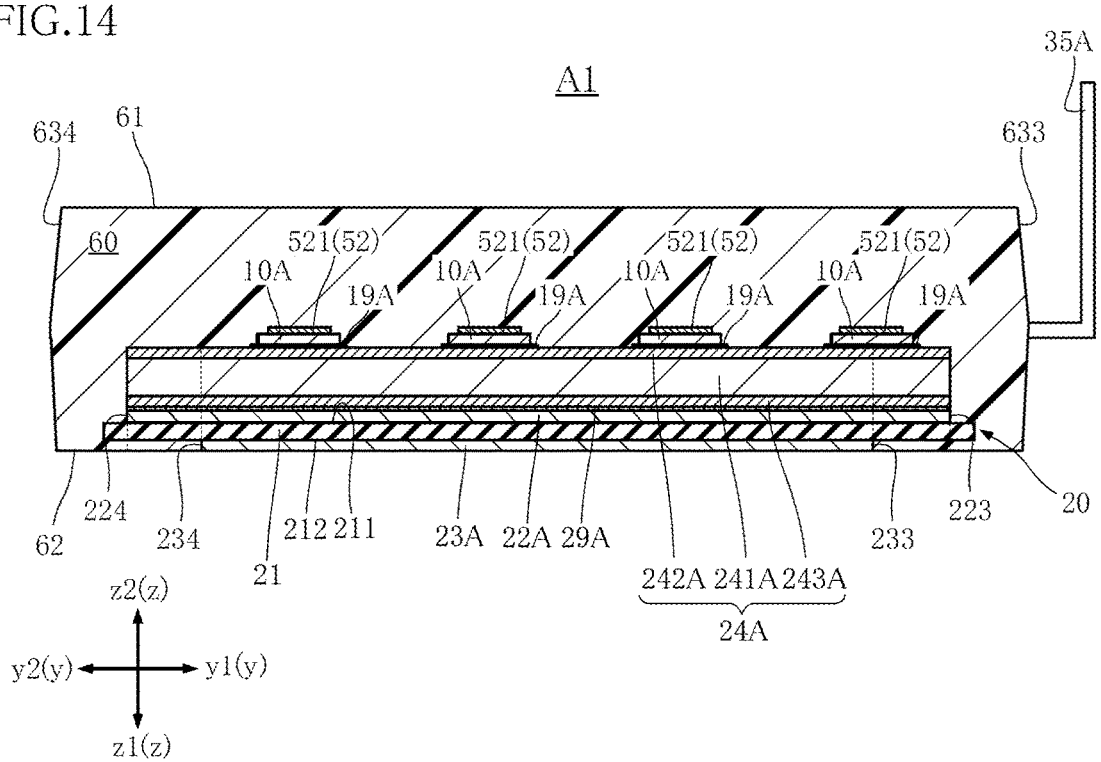
FIG. 14 is a sectional view taken along line XIV-XIV in FIG. 4.
Figure 15:
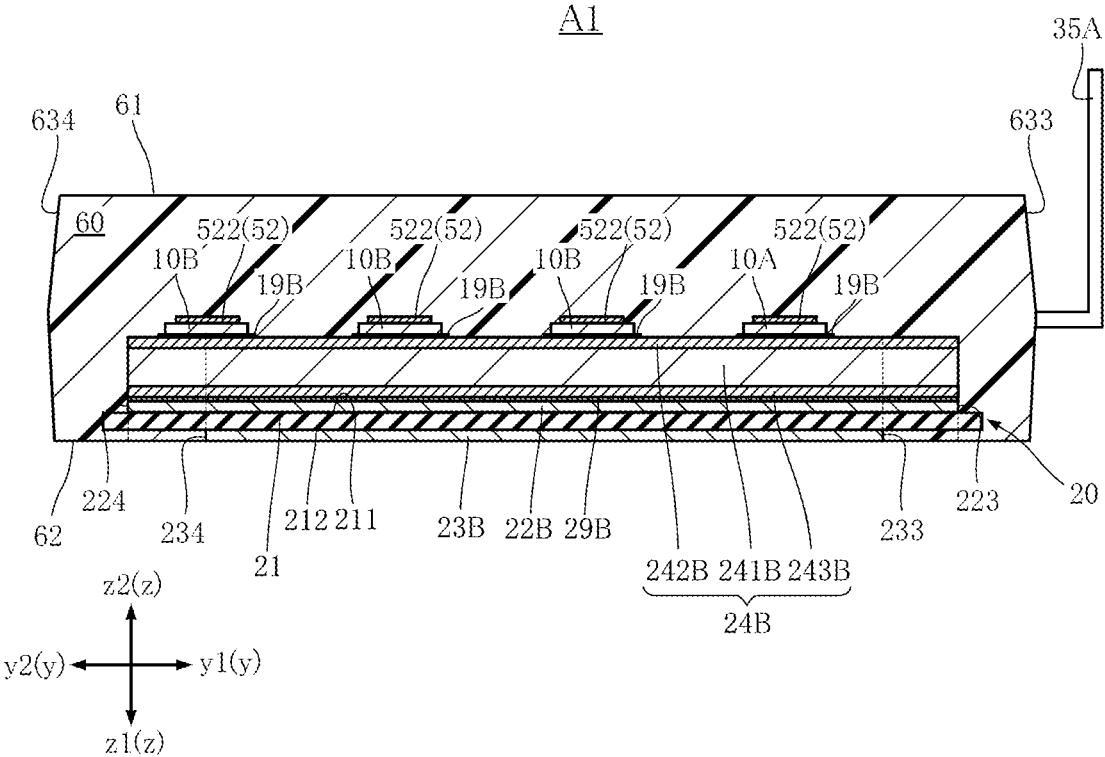
FIG. 15 is a sectional view taken along line XV-XV in FIG. 4.

FIG. 1 is a perspective view of the semiconductor device A1. FIG. 2 is a perspective view corresponding to FIG. 1, with the sealing member 60 omitted. FIG. 3 is a plan view of the semiconductor device A1. FIG. 4 is a plan view corresponding to FIG. 3, with the sealing member 60 indicated by imaginary lines (two-dot chain lines). FIG. 5 is an enlarged view showing a part of FIG. 4. FIG. 6 is a view showing some structural components extracted from the plan view of FIG. 4. FIG. 7 is a front view of the semiconductor device A1. FIG. 8 is a bottom view of the semiconductor device A1. FIG. 9 is a side view (left side view) of the semiconductor device A1. FIG. 10 is a side view (right side view) of the semiconductor device A1. FIG. 11 is a sectional view taken along line XI-XI in FIG. 4. FIG. 12 is a sectional view taken along line XII-XII in FIG. 4. FIG. 13 is an enlarged view showing a part of FIG. 12. FIG. 14 is a sectional view taken along line XIV-XIV in FIG. 4. FIG. 15 is a sectional view taken along line XV-XV in FIG. 4.

For convenience, description is given below with reference to three mutually perpendicular directions (i.e., x direction, y direction and z direction) indicated in in FIGS. 1 to 14. The x direction is the horizontal direction in a plan view (see FIGS. 2 and 3) of the semiconductor device A1. The y direction is the vertical direction in a plan view (see FIGS. 2 and 3) of the semiconductor device A1. As necessary, one sense of the x direction is referred to as x1 direction, and the other sense of the x direction is referred to as x2 direction. Similarly, one sense of the y direction is referred to as y1 direction, and the other sense of the y direction is referred to as y2 direction. Also, one sense of the z direction is referred to as z1 direction, and the other sense of the z direction is referred to as z2 direction. The z1 direction may be referred to as "downward", and the z2 direction may be referred to as "upward". The dimension in the z direction may be referred to as "thickness".

The semiconductor elements 10 are made using a semiconductor material, mainly silicon carbide (SiC). The semiconductor material is not limited to SiC and may be silicon (Si), gallium arsenide (GaAs) or gallium nitride (GaN). The semiconductor elements 10 are MOSFETs (Metal-Oxide-Semiconductor Field-Effect Transistor), for example. The semiconductor elements 10 are not limited to MOSFETs and may be field-effect transistors including MISFETs (Metal-Insulator-Semiconductor FETs), bipolar transistors such as IGBTs (Insulated Gate Bipolar Transistors), IC chips such as LSIs, diodes or capacitors, for example. The plurality of semiconductor elements 10 are all the same element, and may be n-channel MOSFETs, for example. Each semiconductor element 10 is rectangular as viewed in the z direction (hereinafter also referred to as "in plan view"), but the present disclosure is not limited to this. Each semiconductor element 10 may be about 50 to 370 μm in thickness.

The semiconductor elements 10 include a plurality of semiconductor elements 10A and a plurality of semiconductor elements 10B. As shown in FIGS. 2 and 4, the semiconductor device A1 include four semiconductor elements 10A and four semiconductor elements 10B. The number of the semiconductor elements 10 is not limited to this and may vary as appropriate according to the performance required of the semiconductor device A1. When the semiconductor device A1 is a half-bridge switching circuit, the semiconductor elements 10A constitute the upper arm circuit of the switching circuit, and the semiconductor elements 10B constitute the lower arm circuit of the switching circuit.

As shown in FIGS. 2, 4, 5 and 12, the semiconductor elements 10A are mounted on the supporting substrate 20 (conductive member 24A described later). The semiconductor elements 10A are aligned in the y direction and spaced apart from each other. As shown in FIGS. 4, 5 and 12, each semiconductor element 10A is conductively bonded to the supporting substrate 20 (conductive member 24A) with a conductive bonding material 19A. The conductive bonding material 19A may be solder, metal paste or sintered metal, for example.

As shown in FIGS. 2, 4, 5 and 11, the semiconductor elements 10B are mounted on the supporting substrate 20 (conductive member 24B described later). The semiconductor elements 10B are aligned in the y direction and spaced apart from each other. As shown in FIGS. 4, 5 and 11, each semiconductor element 10B is conductively bonded to the supporting substrate 20 (conductive member 24B) with a conductive bonding material 19B. As with the conductive bonding material 19A, the conductive bonding material 19A may be solder, metal paste or sintered metal, for example. In the example shown in FIG. 4, the semiconductor elements 10A and the semiconductor elements 10B are alternately arranged as viewed in the x direction. However, the semiconductor elements 10A and the semiconductor elements 10B may be arranged to overlap with each other as viewed in the x direction.

As shown in FIGS. 11 to 13, each of the semiconductor elements 10 (semiconductor elements 10A and semiconductor elements 10B) has an element obverse surface 101 and an element reverse surface 102. FIG. 13 shows a semiconductor element 10A, but the semiconductor elements 10B are configured in the same way. In each semiconductor element 10, the element obverse surface 101 and the element reverse surface 102 are spaced apart from each other in the z direction. The element obverse surface 101 faces in the z2 direction, and the element reverse surface 102 faces in the z1 direction. The element reverse surface 102 of each semiconductor element 10A faces the conductive member 24A. The element reverse surface 102 of each semiconductor element 10B faces the conductive member 24B.

As shown in FIGS. 5 and 13, each of the semiconductor elements 10 has an obverse-surface electrode 11, a reverse-surface electrode 12 and an insulating film 13.

The obverse-surface electrode 11 is provided on the element obverse surface 101. As shown in FIGS. 4 and 11, the obverse-surface electrode 11 includes a first electrode 111 and a second electrode 112. The first electrode 111 is, for example, a source electrode, through which a source current flows. The second electrode 112 is, for example, a gate electrode, to which a gate voltage for driving the semiconductor element 10 is applied. The first electrode 111 is larger than the second electrode 112. The first electrode 111 is constituted of a single region in the example shown in FIG. 5, but may be divided into a plurality of regions.

As shown in FIG. 13, the reverse-surface electrode 12 is provided on the element reverse surface 102. The reverse-surface electrode 12 is formed on the entirety of the element reverse surface 102. The reverse-surface electrode 12 is, for example, a drain electrode, through which a drain current flows.

As shown in FIGS. 5 and 13, the insulating film 13 is provided on the element obverse surface 101. The insulating film 13 is electrically insulating. The insulating film 13 surrounds the obverse-surface electrode 11 in plan view. The insulating film 13 insulates the first electrode 111 and the second electrode 112 from each other. The insulating film 13 may be made up of a silicon dioxide ($SiO_2$) layer, a silicon nitride ($SiN_4$) layer and a poly benzoxazole layer that are deposited in the mentioned order on the element obverse surface 101. The configuration of the insulating film 13 is not limited to the above, and a polyimide layer may be used instead of the poly benzoxazole layer.

The supporting substrate 20 supports the semiconductor elements 10. The supporting substrate 20 includes an insulating substrate 21, a pair of obverse-surface metal layers 22A and 22B, a pair of reverse-surface metal layers 23A and 23B, a pair of conductive members 24A and 24B, a pair of insulating layers 25A and 25B, a pair of gate layers 26A and 26B, and a pair of detection layers 27A and 27B. The insulating substrate 21, the pair of obverse-surface metal layers 22A and 22B, and the pair of reverse-surface metal layers 23A and 23B are each constituted by a Direct Bonded Copper (DBC) substrate. Although the present embodiment illustrates a DBC substrate, the present disclosure is not limited to this, and a Direct Bonded Aluminum (DBA) substrate may be used instead.

The insulating substrate 21 insulates the obverse-surface metal layers 22A and 22B from the reverse-surface metal layers 23A and 23B, respectively. The insulating substrate 21 is made of a ceramic material having excellent thermal conductivity, for example. Examples of such a ceramic material include aluminum nitride (AlN), silicon nitride (SiN) and aluminum oxide ($Al_2O_3$). The insulating substrate 21 is, for example, about 0.32 mm in thickness. As shown in FIG. 4, the insulating substrate 21 is rectangular in plan view. The insulating substrate is in the form of a single plate.

As shown in FIGS. 11, 12, 14 and 15, the insulating substrate 21 has an obverse surface 211 and a reverse surface 212. The obverse surface 211 and the reverse surface 212 are spaced apart from each other in the z direction. The obverse surface 211 faces in the z2 direction, and the reverse surface 212 faces in the z1 direction. The obverse surface 211 has thereon the obverse-surface metal layers 22A and 22B. The reverse surface 212 has thereon the reverse-surface metal layers 23A and 23B.

As shown in FIGS. 11, 12, 14 and 15, the obverse-surface metal layers 22A and 22B are disposed on the obverse surface 211 of the insulating substrate 21. The obverse-surface metal layers 22A and 22B are spaced apart from each other and arranged side by side in the x direction. The obverse-surface metal layers 22A and 22B are made of copper (Cu), a copper alloy or aluminum (Al), for example. Each of the obverse-surface metal layers 22A and 22B is, for example, about 0.2 mm in thickness. Each of the obverse-surface metal layers 22A and 22B is generally rectangular in plan view. Each of the obverse-surface metal layers 22A and 22B is, for example, about 20 mm in dimension in the x direction and about 30 mm in dimension in the y direction.

As shown in FIGS. 6 and 8, each of the obverse-surface metal layers 22A and 22B has a pair of edges 221 and 222, and a pair of edges 223 and 224. The edges 221 and 222 each extend in the y direction in plan view. The edge 221 and the edge 222 in each pair are spaced apart from each other in the x direction. The edge 222 is located on the x2 side of the edge 221. In the example shown in FIGS. 6 and 8, the edges 221 and edges 222 are generally parallel to each other. The edges 223 and 224 each extend in the x direction in plan view. The edge 223 and the edge 224 in each pair are spaced apart from each other in the y direction. The edge 224 is located on the y2 side of the edge 223. In the example shown in FIGS. 6 and 8, since each of the obverse-surface metal layers 22A and 22B is rectangular in plan view, the edges 223 and 224 are generally parallel to each other as well as the edges 221 and 222.

As shown in FIGS. 11, 12, 14 and 15, the reverse-surface metal layer 23A and 23B are disposed on the reverse surface 212 of the insulating substrate 21. The reverse-surface metal layers 23A and 23B are spaced apart from each other and arranged side by side in the x direction. Each of the reverse-surface metal layers 23A and 23B has a lower surface (facing in the z1 direction) exposed from the sealing member 60. A heat sink (not shown) may be connected to the lower surface of each reverse-surface metal layer 23A and 23B. The material for the reverse-surface metal layers 23A and 23B is the same as that for the obverse-surface metal layer 22A and 22B. That is, the reverse-surface metal layers 23A and 23B are made of Cu, a copper alloy or Al, for example. Each of the reverse-surface metal layers 23A and 23B is, for example, about 0.2 mm in thickness. Each of the reverse-surface metal layers 23A and 23B is generally rectangular in plan view. Each of the reverse-surface metal layers 23A and 23B is, for example, about 20 mm in dimension in the x direction and about 23 mm in dimension in the y direction. The dimension of each reverse-surface metal layer 23A and 23B in the y direction is not limited to the above-noted value (23 mm) and is preferably about 75 to 90% of the dimension of each obverse-surface metal layer 22A and 22B in the y direction.

As shown in FIGS. 6 and 8, each of the reverse-surface metal layers 23A and 23B has a pair of edges 231 and 232, and a pair of edges 233 and 234. The edges 231 and 232 each extend in the y direction in plan view. The edge 231 and the edge 232 in each pair are spaced apart from each other in the x direction. The edge 232 is located on the x2 side of the edge 231. The edges 233 and 234 each extend in the x direction in plan view. The edge 233 and the edge 234 in each pair are spaced apart from each other in the y direction. The edge 234 is located on the y2 side of the edge 233. In the example shown in FIGS. 6 and 8, since each of the reverse-surface metal layers 23A and 23B is rectangular in plan view, the edges 233 and 234 are generally parallel to each other as well as the edges 231 and 232.

As shown in FIG. 6, the edge 233 of the reverse-surface metal layer 23A overlaps with one of the semiconductor elements 10A that is offset furthest in the y1 direction. The edge 234 of the reverse-surface metal layer 23B overlaps with one of the semiconductor elements 10B that is offset furthest in the y2 direction.

As shown in FIGS. 6 and 8, in the supporting substrate 20, the obverse-surface metal layer 22A and the reverse-surface metal layer 23A overlap with each other in plan view, and the obverse-surface metal layer 22B and the reverse-surface metal layer 23B overlap with each other in plan view. In particular, in the example shown in FIG. 6, the center of the obverse-surface metal layer 22A and the center of the obverse-surface metal layer 22B in the y direction overlap with the center of the reverse-surface metal layer 23A and the center of the reverse-surface metal layer 23B in the y direction, respectively, in plan view. The edges 231 of the reverse-surface metal layers 23A and 23B overlap with the edges 221 of the obverse-surface metal layers 22A and 22B, respectively, in plan view. The edges 232 of the reverse-surface metal layers 23A and 23B overlap with the edges 222 of the obverse-surface metal layers 22A and 22B, respectively, in plan view. The edges 233 of the reverse-surface metal layers 23A and 23B overlap with the obverse-surface metal layers 22A and 22B, respectively, in plan view and are offset in the y2 direction from the edges 223 of the obverse-surface metal layers 22A and 22B. The edges 234 of the reverse-surface metal layers 23A and 23B overlap with the obverse-surface metal layers 22A and 22B, respectively, in plan view and are offset in the y1 direction from the edges 224 of the obverse-surface metal layers 22A and 22B.

As shown in FIGS. 4, 11 and 12, the paired conductive members 24A and 24B are spaced apart from each other and arranged side by side in the x direction. The conductive member 24A is disposed on the obverse-surface metal layer 22A, and the conductive member 24B is disposed on the obverse-surface metal layer 22B. The semiconductor elements 10A are disposed on the conductive member 24A, and the semiconductor elements 10B are disposed on the conductive member 24B. The conductive member 24A includes a conductive layer 241A and two metal layers 242A and 243A, and the conductive member 24B includes a conductive layer 241B and two metal layers 242B and 243B.

The conductive layers 241A and 241B are made of graphite, for example. As described above, graphite has a hexagonal crystal and layered structure, with its thermal conductivity different between the direction parallel to the layer and the direction perpendicular to the layer. The thermal conductivity in the direction parallel to the layer is about 1500 W/mK, whereas the thermal conductivity in the direction perpendicular to the layer is about 5 W/mK. Each of the conductive layers 241A and 241B is arranged such that the direction parallel to the layer is along the z direction. Also, as described above, Graphite also has anisotropic coefficient of linear expansion. The coefficient of linear expansion in the direction parallel to the layer is about 0 ppm/K, whereas the coefficient of linear expansion in the direction perpendicular to the layer is about 25 ppm/K. Each of the conductive layers 241A and 241B is arranged such that the direction perpendicular to the layer is along the y direction. Thus, each of the conductive layers 241A and 241B is oriented such that the coefficient of linear expansion in the y direction is about 25 ppm/K while the coefficient of linear expansion in the x direction is about 0 ppm/K. That is, each of the conductive layers 241A and 241B is arranged such that the direction in which the coefficient of linear expansion is relatively large is along the y direction. Each of the conductive layers 241A and 241B is, for example, about 2.0 mm in thickness.

As shown in FIGS. 11 to 15, the metal layers 242A and 242B are disposed on the upper surfaces (facing in the z2 direction) of the conductive layers 241A and 241B, respectively. The metal layers 242A and 242B are made of Cu or a Cu alloy, for example. The metal layers 242A and 242B are provided to enhance the bonding between the conductive member 24A and the semiconductor elements 10A and the bonding between the conductive member 24B and the semiconductor elements 10B, respectively. Each of the metal layers 242A and 242B is, for example, about 0.1 to 0.5 mm in thickness.

As shown in FIGS. 11 to 15, the metal layers 243A and 243B are disposed on the lower surfaces (facing in the z1 direction) of the conductive layers 241A and 241B, respectively. The metal layers 243A and 243B are made of Cu or a Cu alloy, for example. The metal layers 243A and 243B are provided to enhance the bonding between the conductive member 24A and the obverse-surface metal layer 22A and the bonding between the conductive member 24B and the obverse-surface metal layer 22B, respectively. Each of the metal layers 243A and 243B is, for example, about 0.1 to 0.5 mm in thickness.

As shown in FIGS. 11 to 14, a conductive bonding layer 29A is interposed between the conductive member 24A (metal layer 243A) and the obverse-surface metal layer 22A. The conductive member 24A is bonded to the obverse-surface metal layer 22A with the conductive bonding layer 29A. As shown in FIGS. 11, 12 and 15, a conductive bonding layer 29B is interposed between the conductive member 24B (metal layer 243B) and the obverse-surface metal layer 22B. The conductive member 24B is bonded to the obverse-surface metal layer 22B with the conductive bonding layer 29B. Each of the conductive bonding layers 29A and 29B may be solder, metal paste or sintered metal, for example.

The pair of insulating layers 25A and 25B are electrically insulating and made of glass epoxy resin, for example. As shown in FIG. 4, each of the insulating layers 25A and 25B is in the form of a strip extending in the y direction. As shown in FIGS. 4, 5 and 12, the insulating layer 25A is bonded to the conductive member 24A. The insulating layer 25A is offset from the semiconductor elements 10A in the x2 direction. As shown in FIGS. 4, 5 and 11, the insulating layer 25B is bonded to the conductive member 24B. The insulating layer 25B is offset from the semiconductor elements 10B in the x1 direction.

The paired gate layers 26A and 26B are electrically conductive and made of Cu or a Cu alloy, for example. As shown in FIG. 4, each of the gate layers 26A and 26B is in the form of a strip extending in the y direction. As shown in FIGS. 4, 5 and 12, the gate layer 26A is disposed on the insulating layer 25A. The gate layer 26A is electrically connected to the respective second electrodes 112 (gate electrodes) of the semiconductor elements 10A with cord-like connecting members 51 (gate wires 511 described later). As shown in FIGS. 4, 5 and 11, the gate layer 26B is disposed on the insulating layer 25B. The gate layer 26B is electrically connected to the respective second electrodes 112 (gate electrodes) of the semiconductor elements 10B with cord-like connecting members 51 (gate wires 511 described later).

The paired detection layers 27A and 27B are electrically conductive and made of Cu or a Cu alloy, for example. As shown in FIG. 4, each of the detection layers 27A and 27B is in the form of a strip extending in the y direction. As shown in FIGS. 4, 5 and 12, the detection layer 27A is disposed on the insulating layer 25A along with the gate layer 26A. In plan view, the detection layer 27A is located adjacent to the gate layer 26A and spaced apart from the gate layer 26A on the insulating layer 25A. In the example shown in FIGS. 4, 5 and 12, the detection layer 27A is offset from the gate layer 26A in the x1 direction and located closer to the semiconductor elements 10A than is the gate layer 26A. The arrangement of the gate layer 26A and the detection layer 27A in the x direction may be reversed. The detection layer 27A is electrically connected to the respective first electrodes 111 (source electrodes) of the semiconductor elements 10A with cord-like connecting members 51 (detection wires 512 described later). As shown in FIGS. 4, 5 and 11, the detection layer 27B is disposed on the insulating layer 25B along with the gate layer 26B. In plan view, the detection layer 27B is located adjacent to the gate layer 26B and spaced apart from the gate layer 26B on the insulating layer 25B. In the example shown in FIGS. 4, 5 and 11, the detection layer 27B is offset from the gate layer 26B in the x2 direction and located closer to the semiconductor elements 10B than is the gate layer 26B. The arrangement of the gate layer 26B and the detection layer 27B in the x direction may be reversed. The detection layer 27B is electrically connected to the respective first electrodes 111 (source electrodes) of the semiconductor elements 10B with cord-like connecting members 51 (detection wires 512 described later).

Each of the two input terminals 31 and 32 is a metal plate. The metal plate is made of Cu or a Cu alloy. The two input terminals 31 and 32 both have a dimension of about 0.8 mm in the z direction, but are not limited to this. As shown in FIGS. 1, 4, 11 and 12, the two input terminals 31 and 32 both are located on the x2 side in the semiconductor device A1. A power supply voltage may be applied between the two input terminals 31 and 32. The power supply voltage may be applied from a power supply (not shown) directly to the input terminals 31 and 32 or via a busbar (not shown) connected to flank the input terminals 31 and 32. A snubber circuit, for example, may be connected in parallel. The input terminal 31 is a positive terminal (P terminal), and the input terminal 32 is a negative terminal (N terminal). The input terminal 32 is spaced apart from both of the input terminal 31 and the supporting substrate 20 (conductive member 24A) in the z direction.

As shown in FIGS. 4 and 11, the input terminal 31 includes a pad portion 311 and a terminal portion 312.

The pad portion 311 is the portion of the input terminal 31 that is covered with the sealing member 60. In the example shown in FIG. 4, the end of the pad portion 311 on the x1 side has a comb-like shape in plan view. However, the end may not have a comb-like shape but may be, for example, rectangular in plan view. The pad portion 311 is conductively bonded to the conductive member 24A (metal layer 242A) at the comb-like end. The bonding between the pad portion 311 and the conductive member 24A may be made by laser bonding, ultrasonic bonding or by using a conductive bonding material.

The terminal portion 312 is the portion of the input terminal 31 that is exposed from the sealing member 60. As shown in FIGS. 4, 7, 8, 10 and 11, the terminal portion 312 extends out of the sealing member 60 in the x2 direction.

As shown in FIGS. 4 and 11, the input terminal 32 includes a pad portion 321 and a terminal portion 322.

The pad portion 321 is the portion of the input terminal 32 that is covered with the sealing member 60. As shown in FIG. 4, the pad portion 321 includes a connecting part 321a and a plurality of extensions 321b. The connecting part 321a is in the form of a strip extending in the y direction. The connecting part 321a is connected to the terminal portion 322. Each of the extensions 321b is in the form of a strip extending from the connecting part 321a in the x1 direction. The extensions 321b are spaced apart from each other and arranged side by side in the y direction in plan view. Each of the extensions 321b has an end overlapping with and bonded to a respective one of the base parts 41. Such bonding may be made by laser welding using a laser beam, ultrasonic bonding, or by using a bonding material. The above-noted end is the end of each extension 321b on the x1 side and opposite from the end connected to the connecting part 321a in the x direction.

The terminal portion 322 is the portion of the input terminal 32 that is exposed from the sealing member 60. As shown in FIGS. 3, 4 and 8, the terminal portion 322 extends out of the sealing member 60 in the x2 direction. The terminal portion 322 is rectangular in plan view. As shown in FIGS. 3, 4 and 8, the terminal portion 322 overlaps with the terminal portion 312 of the input terminal 31 in plan view. The terminal portion 322 is spaced apart from the terminal portion 312 in the z2 direction. The shape of the terminal portion 322 may be the same as that of the terminal portion 312.

The output terminal 33 is a metal plate. The metal plate is made of Cu or a Cu alloy, for example. As shown in FIGS. 1, 3, 4, 7, 8 and 11, the output terminal 33 is located on the x1 side in the semiconductor device A1. The AC power (voltage) converted by the semiconductor elements 10 is output from the output terminal 33.

As shown in FIGS. 4 and 11, the output terminal 33 includes a pad portion 331 and a terminal portion 332.

The pad portion 331 is the portion of the output terminal 33 that is covered with the sealing member 60. In the example shown in FIG. 4, the part of the pad portion 331 that is offset in the x2 direction has a comb-like shape in plan view. However, this part may not have a comb-like shape but may be rectangular in plan view. The pad portion 331 is conductively bonded to the conductive member 24B (metal layer 242B) at the comb-like part. The bonding between the pad portion 331 and the conductive member 24B may be made by laser bonding, ultrasonic bonding or by using a conductive bonding material.

The terminal portion 332 is the portion of the output terminal 33 that is exposed from the sealing member 60. As shown in FIGS. 3, 4, 7, 8, 11 and 12, the terminal portion 332 extends out of the sealing member 60 in the x1 direction.

As shown in FIGS. 2, 4 and 5, the gate terminals 34A and 34B are located adjacent to the conductive members 24A and 24B, respectively, in the y direction. A gate voltage for driving the semiconductor elements 10A is applied to the gate terminal 34A. A gate voltage for driving the semiconductor elements 10B is applied to the gate terminal 34B.

As shown in FIG. 5, the gate terminals 34A and 34B each include a pad portion 341 and a terminal portion 342. In each of the gate terminals 34A and 34B, the pad portion 341 is covered with the sealing member 60. Thus, the gate terminals 34A and 34B are supported by the sealing member 60. The surfaces of the pad portions 341 may be plated with silver, for example. The terminal portions 342 are connected to the pad portions 341 and exposed from the sealing member 60. The terminal portions 342 are L-shaped as viewed in the x direction.

As shown in FIGS. 2, 4 and 5, the detection terminals 35A and 35B are located adjacent to the gate terminals 34A and 34B, respectively, in the x direction. From the detection terminal 35A, the voltage (corresponding to the source current) applied to the obverse-surface electrode 11 (first electrode 111) of each semiconductor element 10A is detected. From the detection terminal 35B, the voltage (corresponding to the source current) applied to the obverse-surface electrode 11 (first electrode 111) of each semiconductor element 10B is detected.

As shown in FIG. 5, the detection terminals 35A and 35B each include a pad portion 351 and a terminal portion 352. In each of the detection terminals 35A and 35B, the pad portion 351 is covered with the sealing member 60. Thus, the detection terminals 35A and 35B are supported by the sealing member 60. The surfaces of the pad portions 351 may be plated with silver, for example. The terminal portions 352 are connected to the pad portions 351 and exposed from the sealing member 60. The terminal portions 352 are L-shaped as viewed in the x direction.

As shown in FIGS. 2, 4 and 5, the dummy terminals 36 are located on the opposite side of the detection terminal 35A or 35B with respect to the gate terminal 34A or 34B in the x direction. The semiconductor device A1 has six dummy terminals 36. Three of these dummy terminals 36 are offset in one sense of the x direction (x2 direction). The remaining three dummy terminals 36 are offset in the other sense of the x direction (x1 direction). The number and arrangement of the dummy terminals 36 are not limited to the above. Also, the configuration that does not include dummy terminals 36 may be employed.

As shown in FIG. 5, each of the dummy terminals 36 includes a pad portion 361 and a terminal portion 362. In each of the dummy terminals 36, the pad portion 361 is covered with the sealing member 60. Thus, the dummy terminals 36 are supported by the sealing member 60. The surfaces of the pad portions 361 may be plated with silver, for example. The terminal portions 362 are connected to the pad portions 361 and exposed from the sealing member 60. The terminal portions 362 are L-shaped as viewed in the x direction. The shape of the terminal portions 362 is the same as that of the terminal portions 342 of the gate terminals 34A and 34B and that of the terminal portions 352 of the detection terminals 35A and 35B.

As shown in FIGS. 2 and 4, each of the side terminals 37A and 37B overlaps with a portion which corresponds to an end of the sealing member 60 in the y1 direction and also to an end of the sealing member 60 in the x direction. The side terminal 37A is bonded to the conductive member 24A and covered with the sealing member 60 except its end surface facing in the x2 direction. The side terminal 37B is bonded to the conductive member 24B and covered with the sealing member 60 except its end surface facing in the x1 direction. Each of the side terminals 37A and 37B entirely overlaps with the sealing member 60 in plan view. The bonding of the side terminals 37A and 37B may be made by using a bonding material, by laser bonding or by ultrasonic bonding. Each of the side terminals 37A and 37B includes a portion bent in plan view and a portion bent in the z direction. The side terminals 37A and 37B is not limited to such a configuration and may extend out of the sealing member 60 in plan view. The semiconductor device A1 may not include the side terminals 37A and 37B.

As shown in FIGS. 1 to 5, 7 and 8, the gate terminals 34A and 34B, the detection terminals 35A and 35B, and the dummy terminals 36 are arranged along the x direction in plan view. In the semiconductor device A1, the gate terminals 34A and 34B, the detection terminals 35A and 35B, and the dummy terminals 36 are made of the same lead frame.

An insulating plate 39 is electrically insulating and made of, for example, an insulating sheet material. As shown in FIGS. 4, 7, 10, 11 and 12, a part of the insulating plate 39 is a flat plate and sandwiched between the terminal portion 312 of the input terminal 31 and the terminal portion 322 of the input terminal 32 in the z direction. The entirety of the input terminal 31 overlaps with the insulating plate 39 in plan view. Also, a part of the pad portion 321 and the entirety of the terminal portion 322 of the input terminal 32 overlap with the insulating plate 39 in plan view. The insulating plate 39 insulates the two input terminals 31 and 32 from each other. A part of the insulating plate 39 (the part offset in the x1 direction) is covered with the sealing member 60.

As shown in FIG. 11, the insulating plate 39 includes an intervening portion 391 and an extension 392. The intervening portion 391 intervenes between the terminal portion 312 of the input terminal 31 and the terminal portion 322 of the input terminal 32 in the z direction. The entirety of the intervening portion 391 is sandwiched between the terminal portion 312 and the terminal portion 322. The extension 392 extends from the intervening portion 391 in the x2 direction, further than the terminal portion 312 and the terminal portion 322.

The base parts 41 are electrically insulating and made of a ceramic material, for example. As shown in FIG. 11, the base parts 41 are bonded to the surface of the conductive member 24A. The base parts 41 are, for example, rectangular in plan view. The base parts 41 are aligned in the y direction and spaced apart from each other. The dimension of each base part 41 in the z direction is approximately the same as the sum of the dimension of the input terminal 31 in the z direction and the dimension of the insulating plate 39 in the z direction. Each extension 321B of the pad portion 321 of the input terminal 32 is bonded to a relevant one of the base parts 41. The base parts 41 supports the input terminal 32 such that the input terminal 32 is generally parallel with the supporting substrate 20.

The cord-like connecting members 51 are bonding wires. The cord-like connecting members 51 are electrically conductive and made of Al, Cu, a clad material, or an alloy containing one or more of these, for example. As shown in FIGS. 4 and 5, the cord-like connecting members 51 include a plurality of gate wires 511, a plurality of detection wires 512, a pair of first connecting wires 513 and a pair of second connecting wires 514.

As shown in FIGS. 4 and 5, each of the gate wires 511 is bonded to the second electrode 112 (gate electrode) of one of the semiconductor elements 10 and one of the paired gate layers 26A and 26B. The gate wires 511 include those electrically connecting the second electrodes 112 of the semiconductor elements 10A and the gate layer 26A and those electrically connecting the second electrodes 112 of the semiconductor elements 10B and the gate layer 26B.

As shown in FIGS. 4, 5, 11 and 12, each of the detection wires 512 is bonded to the first electrode 111 (source electrode) of one of the semiconductor elements 10 and one of the paired detection layers 27A and 27B. The detection wires 512 include those electrically connecting the first electrodes 111 of the semiconductor elements 10A and the detection layer 27A and those electrically connecting the first electrodes 111 of the semiconductor elements 10B and the detection layer 27B.

As shown in FIGS. 4 and 5, a first one of the first connecting wires 513 electrically connects the gate layer 26A and the gate terminal 34A, and a second one electrically connects the gate layer 26B and the gate terminal 34B. The first one of the first connecting wires 513 is bonded to the gate layer 26A and the pad portion 341 of the gate terminal 34A. The second one of the first connecting wires 513 is bonded to the gate layer 26B and the pad portion 341 of the gate terminal 34B.

As shown in FIGS. 4 and 5, a first one of the second connecting wires 514 electrically connects the detection layer 27A and the detection terminal 35A, and a second one electrically connects the detection layer 27B and the insulating layer 25B. The first one of the second connecting wires 514 is bonded to the detection layer 27A and the pad portion 351 of the detection terminal 35A. The second one of the second connecting wires 514 is bonded to the detection layer 27B and the pad portion 351 of the detection terminal 35B.

The plate-like connecting members 52 are electrically conductive and made of Cu, a Cu alloy, a Copper-Molybdenum (CuMO) composite material or a Copper-Invar-Copper (CIC) composite material, for example. Each plate-like connecting member 52 may be made by bending a metal plate. As shown in FIGS. 4 and 5, the plate-like connecting members 52 include a plurality of first leads 521 and a plurality of second leads 522. In the semiconductor device A1, bonding wires similar to the cord-like connecting members 51 may be used instead of the plate-like connecting members 52.

As shown in FIGS. 4, 5 and 12, each of the first leads 521 electrically connects one of the semiconductor elements 10A and the conductive member 24B. Each of the first leads 521 is bonded to the first electrode 111 (source electrode) of one of the semiconductor elements 10A and the metal layer 242B of the conductive member 24B. The bonding of the first leads 521 is made with a conductive bonding material such as solder or silver paste, for example, but may be made by ultrasonic bonding or laser bonding. Each of the first leads 521 has a portion bent in the z direction.

As shown in FIGS. 4, 5 and 11, each of the second leads 522 electrically connects one of the semiconductor elements 10B and the input terminal 32. Each of the second leads 522 is bonded to the first electrode 111 (source electrode) of one of the semiconductor elements 10B and a relevant one of the extensions 321b of the pad portion 321 of the input terminal 32. The bonding of the second leads 522 is made with a conductive bonding material such as solder or silver paste, for example, but may be made by ultrasonic bonding or laser bonding. Each of the second leads 522 has a portion bent in the z direction.

As shown in FIGS. 1, 3 to 5, and 7 to 15, the sealing member 60 covers the semiconductor elements 10, a part of the supporting substrate 20, a part of each of the input terminals 31 and 32, a part of the output terminal 33, a part of each of the gate terminals 34A and 34B, a part of each of the detection terminals 35A and 35B, a part of each dummy terminal 36, a part of each of the side terminals 37A and 37B, the base parts 41, the cord-like connecting members 51 and the plate-like connecting members 52. The sealing member 60 is made of an insulating resin such as epoxy resin. The sealing member 60 may be formed by transfer molding, for example. The sealing member 60 has a dimension of about 10 mm in the z direction, for example. As shown in FIGS. 1, 3 to 5, 7 to 12, 14 and 15, the sealing member 60 has a resin obverse surface 61, a resin reverse surface 62 and a plurality of resin side surfaces 631 to 634.

As shown in FIGS. 7, 9 to 12, 14 and 15, the resin obverse surface 61 and the resin reverse surface 62 are spaced apart from each other in the z direction. The resin obverse surface 61 faces in the z1 direction, and the resin reverse surface 62 faces in the z2 direction. As shown in FIG. 8, the resin reverse surface 62 has a frame shape surrounding the reverse-surface metal layers 23A and 23B in plan view. The resin side surfaces 631 to 634 are connected to the resin obverse surface 61 and the resin reverse surface 62 and flanked by these surfaces in the z direction. As shown in FIGS. 3, 4, 7, 8, 11 and 12, the two resin side surfaces 631 and 632 are spaced apart from each other in the x direction. The resin side surface 631 faces in the x1 direction, and the resin side surface 632 faces in the x2 direction. As shown in FIGS. 3, 4, 8 to 10, 14 and 15, the two resin side surfaces 633 and 634 are spaced apart from each other in the y direction. The resin side surface 633 faces in the y1 direction, and the resin side surface 634 faces in the y2 direction.

As shown in FIGS. 1, 7, 8, 11 and 12, the sealing member 60 has a plurality of grooves 65 recessed from the resin reverse surface 62 in the z direction. The grooves 65 each extend in the y direction and continuous from the edge on the y1 side to the edge on the y2 side of the resin reverse surface 62 in plan view. The grooves 65 are formed three each across the reverse-surface metal layers 23A and 23B in the x-direction. The sealing member 60 may not be formed with grooves 65.

The advantages of the semiconductor device A1 according to the first embodiment are described below.

In the semiconductor device A1, each of the two conductive layers 241A and 241B is arranged such that the direction in which the coefficient of linear expansion is relatively large is along the z direction. Moreover, the dimensions of the reverse-surface metal layers 23A and 23B in the y direction are smaller than the dimensions of the obverse-surface metal layers 22A and 22B in the y direction, respectively. With such a configuration, when the constituent members thermally expand or contract due to the heat cycle during the manufacture of the semiconductor device A1 or the operation of the semiconductor elements 10A and 10B, the constraint applied to the insulating substrate 21 by the reverse-surface metal layers 23A and 23B is reduced as compared with when the dimensions of the reverse-surface metal layers 23A and 23B in the y direction are the same as the dimensions of the obverse-surface metal layers 22A and 22B in the y direction. This reduces the warpage of the supporting substrate 20 (insulating substrate 21 in particular). Thus, the reliability of the semiconductor device A1 is improved. To achieve a reduced warpage of the supporting substrate 20 without considerably increasing the thermal resistance of the supporting substrate 20, the dimensions of the reverse-surface metal layers 23A and 23B in the y direction are preferably about 75 to 90% of the dimensions of the obverse-surface metal layers 22A and 22B, respectively, in the y direction.

In the semiconductor device A1, the insulating substrate 21 is made of a ceramic material. Since the coefficient of linear expansion of a ceramic material is small, the thermal expansion and contraction of the insulating substrate 21 due to the above-noted heat cycle are small. Meanwhile, the obverse-surface metal layers 22A and 22B and the reverse-surface metal layers 23A and 23B are made of Cu or a Cu alloy. Since the coefficient of linear expansion of Cu is large, the thermal expansion and contraction of the obverse-surface metal layers 22A and 22B and the reverse-surface metal layers 23A and 23B due to the heat cycle are large. That is, due to the heat cycle, a large thermal stress can be applied to the insulating substrate 21. Such a large thermal stress may cause a large warpage of the supporting substrate 20 when the dimensions of the reverse-surface metal layers 23A and 23B in the y direction are the same as the dimensions of the obverse-surface metal layers 22A and 22B in the y direction. Making the dimensions of the reverse-surface metal layers 23A and 23B in the y direction smaller than the dimensions of the obverse-surface metal layers 22A and 22B in the y direction is effective in reducing the warpage of the supporting substrate 20.

In the semiconductor device A1, the conductive layers 241A and 241B (the conductive members 24A and 24B) are disposed on the single insulating substrate 21. Such a configuration can increase the thermal stress applied to the insulating substrate 21 during the above-described heat cycle. Thus, the supporting substrate 20 may warp significantly when the dimensions of the reverse-surface metal layers 23A and 23B in the y direction are the same as the dimensions of the obverse-surface metal layers 22A and 22B in the y direction. Making the dimensions of the reverse-surface metal layers 23A and 23B in the y direction smaller than the dimensions of the obverse-surface metal layers 22A and 22B in the y direction is effective in reducing the warpage of the supporting substrate 20.

In the semiconductor device A1, the edges 233 and 234 of the reverse-surface metal layer 23A and the edges 233 and 234 of the reverse-surface metal layer 23B overlap with the obverse-surface metal layer 22A and the obverse-surface metal layer 22B, respectively, in plan view. The edges 231 and 232 of the reverse-surface metal layer 23A and the edges 231 and 232 of the reverse-surface metal layer 23B overlap with the edges 221 and 222 of the obverse-surface metal layer 22A and the edges 221 and 222 of the obverse-surface metal layer 22B, respectively, in plan view. Studies by the inventor of the present application have revealed that the warpage of the supporting substrate 20 is effectively reduced by reducing the dimensions of the reverse-surface metal layers 23A and 23B in the direction in which the coefficient of linear expansion of the conductive layers 241A and 241B is relatively large, i.e., in the y direction. That is, reduction of the warpage of the supporting substrate 20 can be achieved without making the dimensions in the x direction smaller. The reverse-surface metal layers 23A and 23B are exposed from the sealing member 60, and a heat sink can be connected to these layers. Thus, the larger the area in plan view of each of the reverse-surface metal layers 23A and 23B, the greater the heat dissipation, and the smaller the area in plan view of each of the reverse-surface metal layers 23A and 23B, the smaller the heat dissipation. In the semiconductor device A1, while the dimensions of the reverse-surface metal layers 23A and 23B in the y direction are made smaller than the dimensions of the obverse-surface metal layers 22A and 22B in the y direction, the dimensions of the reverse-surface metal layers 23A and 23B in the x direction are made approximately the same as the dimensions of the obverse-surface metal layers 22A and 22B in the x direction, so that the area in plan view of each of the reverse-surface metal layers 23A and 23B is prevented from becoming unnecessarily small. Thus, the semiconductor device A1 can reduce the warpage of the supporting substrate 20 while preventing degradation of heat dissipation.

Although the first embodiment shows the example in which the insulating substrate 21 is made of a ceramic material, an insulating resin material may be used instead of a ceramic material. Examples of such an insulating resin material include epoxy resin materials and polydimethylsiloxane (PDMS) resin materials. Since these resin materials have a lower Young's modulus than ceramic materials, the warpage of the supporting substrate 20 is further reduced. For example, while the Young's modulus of silicon nitride (SiN), which is a ceramic material, is about 300 GPa, the Young's modulus of epoxy resin materials is about 14 GPa. Moreover, the Young's modulus of PDMS resin materials is about 5 MPa. A larger Young's modulus provides a higher stiffness. That is, the above-noted insulating resin materials have a lower stiffness (softer) than ceramic materials. Thus, even when there is a difference in the amount of expansion during thermal expansion due to the above-noted heat cycle, the softness of the insulating substrate 21 alleviates the thermal stress on the supporting substrate 20. Thus, the warpage of the supporting substrate 20 can be further reduced. Studies by the inventor of the present application have revealed that using an insulating resin material having a Young's modulus of about 50 GPa or less (preferably about 10 GPa or less) for the insulating substrate 21 further reduces the warpage of the supporting substrate 20.

Figure 16:
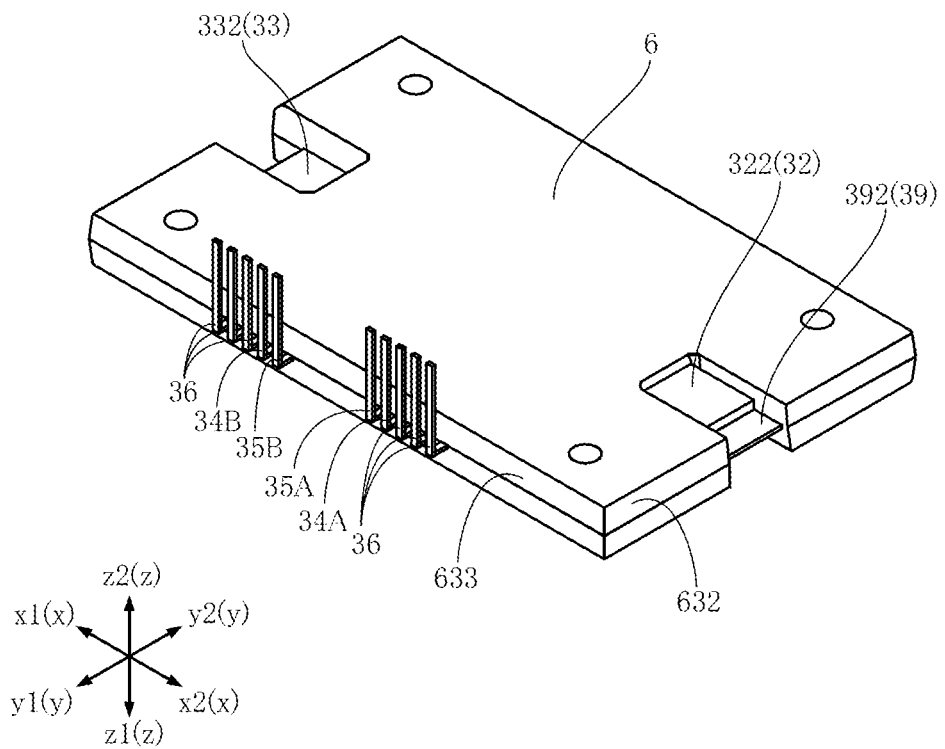
FIG. 16 is a perspective view of a semiconductor device according to a variation of the first embodiment.

In the first embodiment, the shape of the sealing member 60 is not limited to that described above. FIG. 16 is a perspective view of a semiconductor device having a sealing member 60 of a different shape. In the sealing member 60 shown in FIG. 16, the opposite ends in the y direction protrude in the x direction. The portion of the sealing member 60 that protrudes in the x2 direction covers a part of each of the two input terminals 31 and 32 and a part of the insulating plate 39. The portion of the sealing member 60 that protrudes in the x1 direction covers a part of the output terminal 33. According to this variation, parts of the two input terminals 31 and 32, output terminal 33 and insulating plate 39, which are exposed from the sealing member 60 in the semiconductor device A1, are protected.

Figure 17:
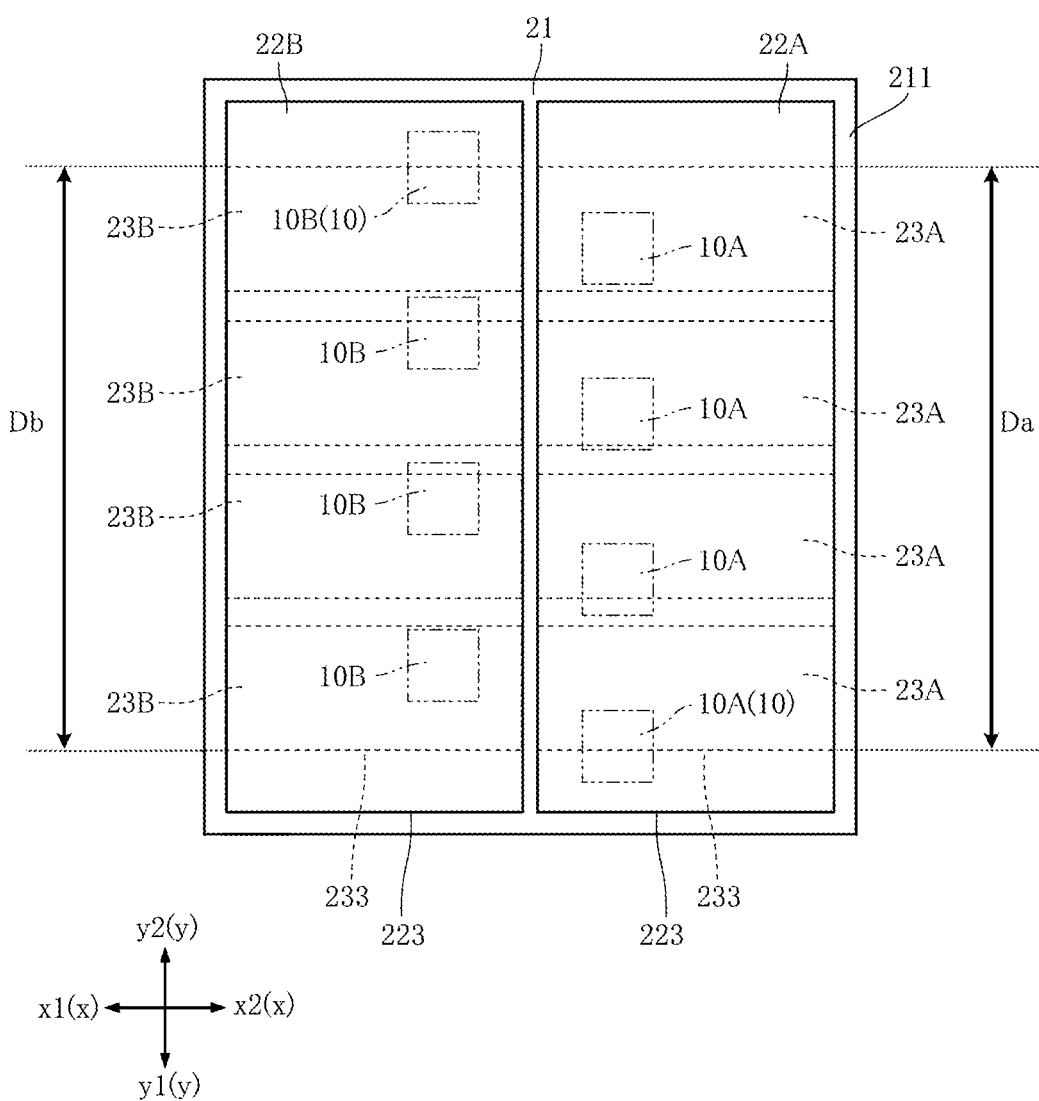
FIG. 17 is a plan view of the semiconductor device according to the variation of the first embodiment, showing some parts extracted.

In the first embodiment, each of the reverse-surface metal layers 23A and 23B may be divided. FIG. 17 is a plan view (showing some structural components extracted) of a semiconductor device in which each of the reverse-surface metal layers 23A and 23B is divided. In the example shown in FIG. 17, each of the reverse-surface metal layers 23A and 23B is divided into four parts, but the number of divisions is not limited to this. In any case, the dimension Da and the dimension db should be approximately the same as the dimension in the y direction from the edge 233 to the edge 234 of the reverse-surface metal layer 23A and that of the reverse-surface metal layer 23B, respectively, of the semiconductor device A1.

Figure 18:
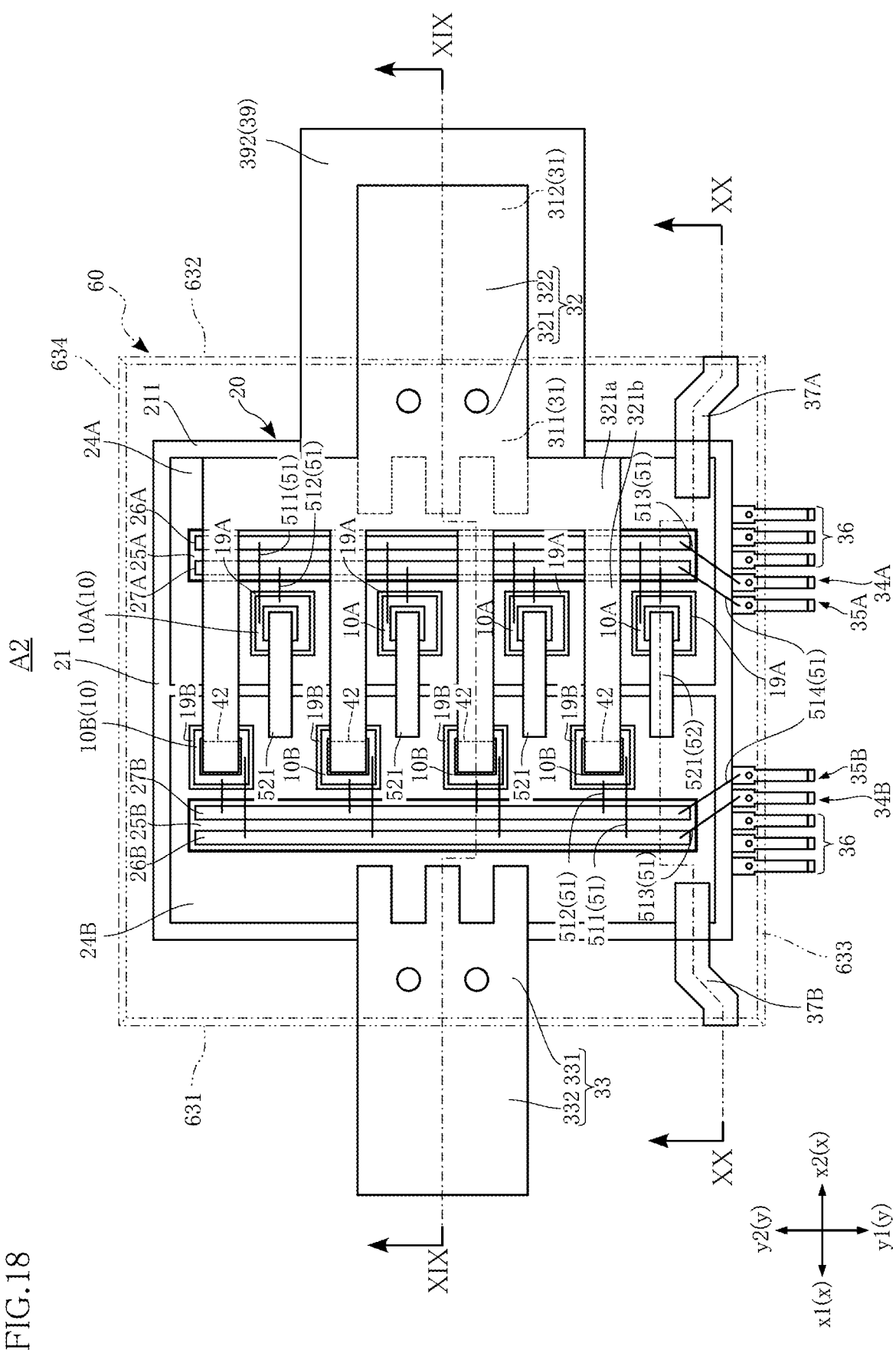
FIG. 18 is a plan view of a semiconductor device according to a second embodiment.
Figure 19:
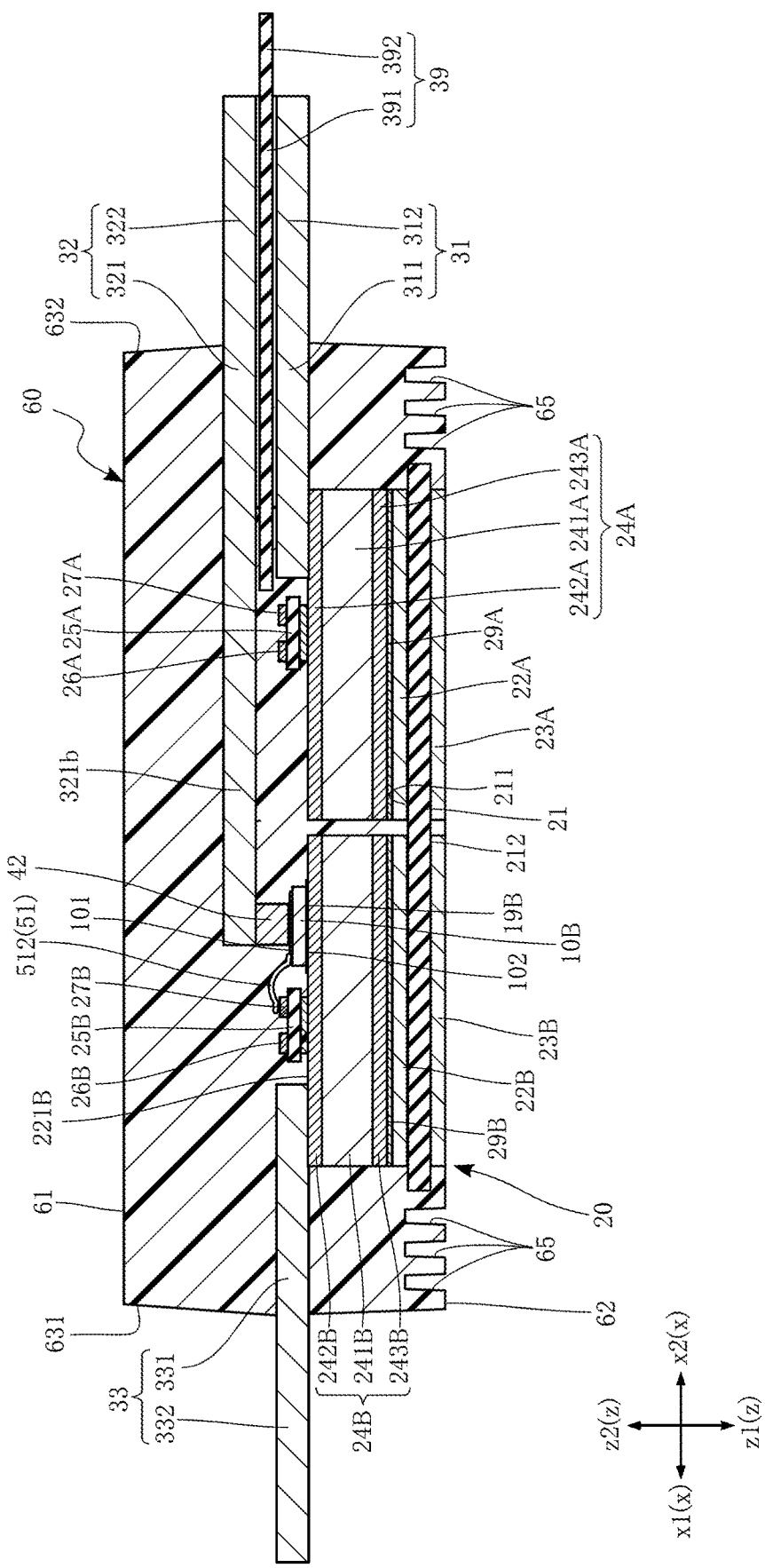
FIG. 19 is a sectional view taken along line XIX-XIX in FIG. 18.
Figure 20:
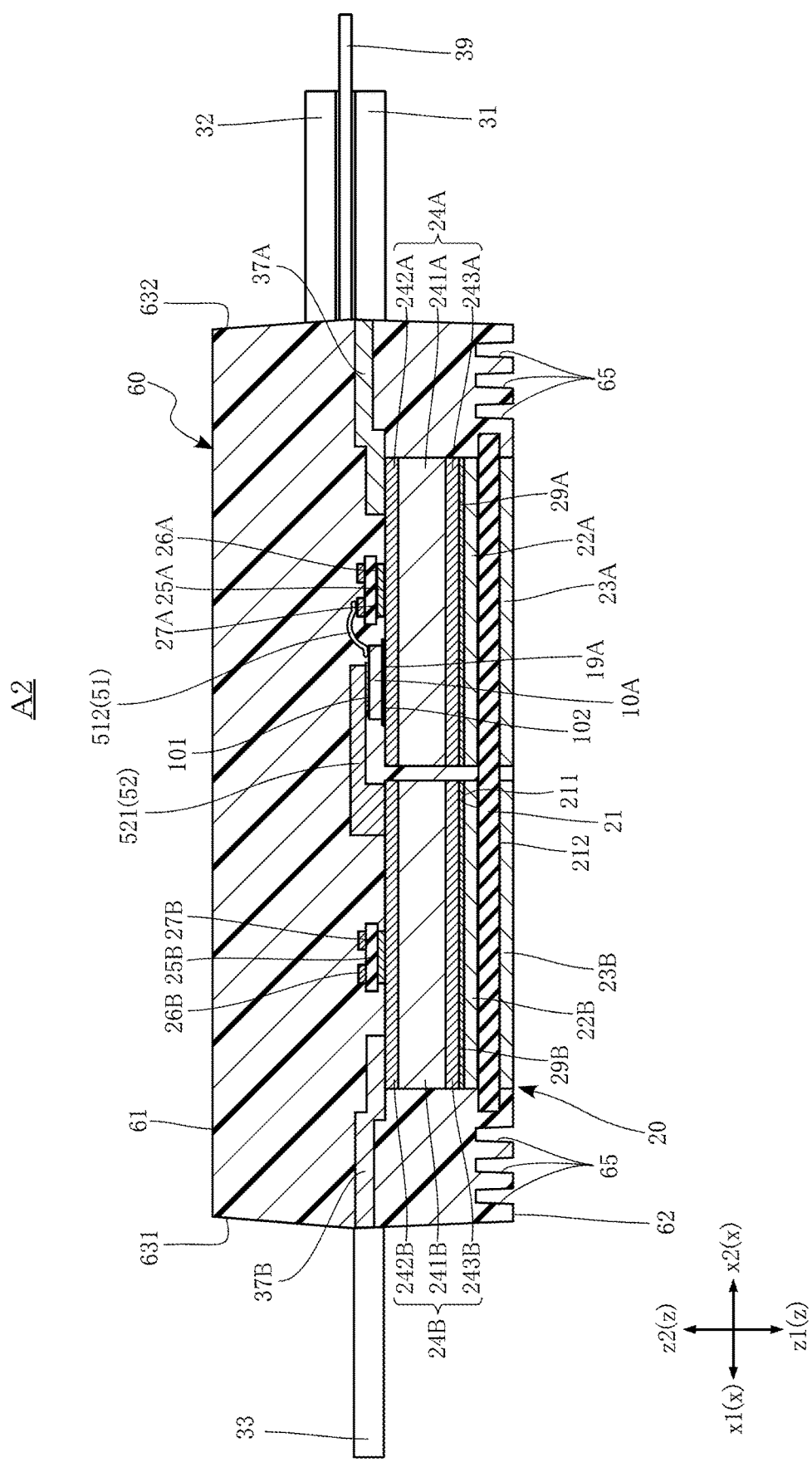
FIG. 20 is a sectional view taken along line XX-XX in FIG. 18.

FIGS. 18 to 20 show a semiconductor device A2 according to a second embodiment. FIG. 18 is a plan view of the semiconductor device A2, with the sealing member 60 indicated by imaginary lines (two-dot chain lines). FIG. 19 is a sectional view taken along line XIX-XIX in FIG. 18. FIG. 20 is a sectional view taken along line XX-XX in FIG. 18.

The semiconductor device A2 (FIG. 18) differs from the semiconductor device A1 (FIG. 4) in shape of the first lead 521. Moreover, the semiconductor device A2 does not include the second lead 522 (FIG. 4).

Unlike the first leads 521 of the semiconductor device A1, each first lead 521 of the semiconductor device A2 is not bent, but has a relatively large thickness at a portion bonded to the conductive member 24B. Such a large thickness allows the first leads 521 to be bonded to the conductive member 24B without bending. Note that the first leads 521 of the semiconductor device A1 may be used in the semiconductor device A2, instead of the first leads 521 of the semiconductor device A2. Also, the first leads 521 of the semiconductor device A2 may be used in the semiconductor device A1, instead of the first leads 521 of the semiconductor device A1.

As shown in FIG. 18, in the semiconductor device A2, the extensions 321b of the pad portion 321 of the input terminal 32 are extended to overlap with the semiconductor elements 10B in plan view. As shown in FIGS. 18 and 19, a conductive block member 42 is disposed between each of the semiconductor elements 10B and a corresponding one of the extensions 321b. The block members 42 are bonded to the extensions 321b and the semiconductor elements 10B (first electrodes 111). The bonding between the extensions 321b and the block members 42 and between the block members 42 and the semiconductor elements 10B (first electrodes 111) may be made by laser bonding, ultrasonic bonding or by using a conductive bonding material. The material for the block members 42 is not limited and may be Cu, a Cu alloy, a CuMO composite material or a CIC composite material, for example. In this way, in the semiconductor device A2, the input terminal 32 and the semiconductor elements 10B are electrically connected to each other without using the second leads 522.

The configurations of other parts of the semiconductor device A2 are the same as those of the semiconductor device A1.

In the semiconductor device A2 again, as with the semiconductor device A1, the dimensions of the reverse-surface metal layers 23A and 23B in the y direction are smaller than those of the obverse-surface metal layers 22A and 22B. Thus, as with the semiconductor device A1, the semiconductor device A2 can reduce the warpage of the supporting substrate 20.

Figure 21:
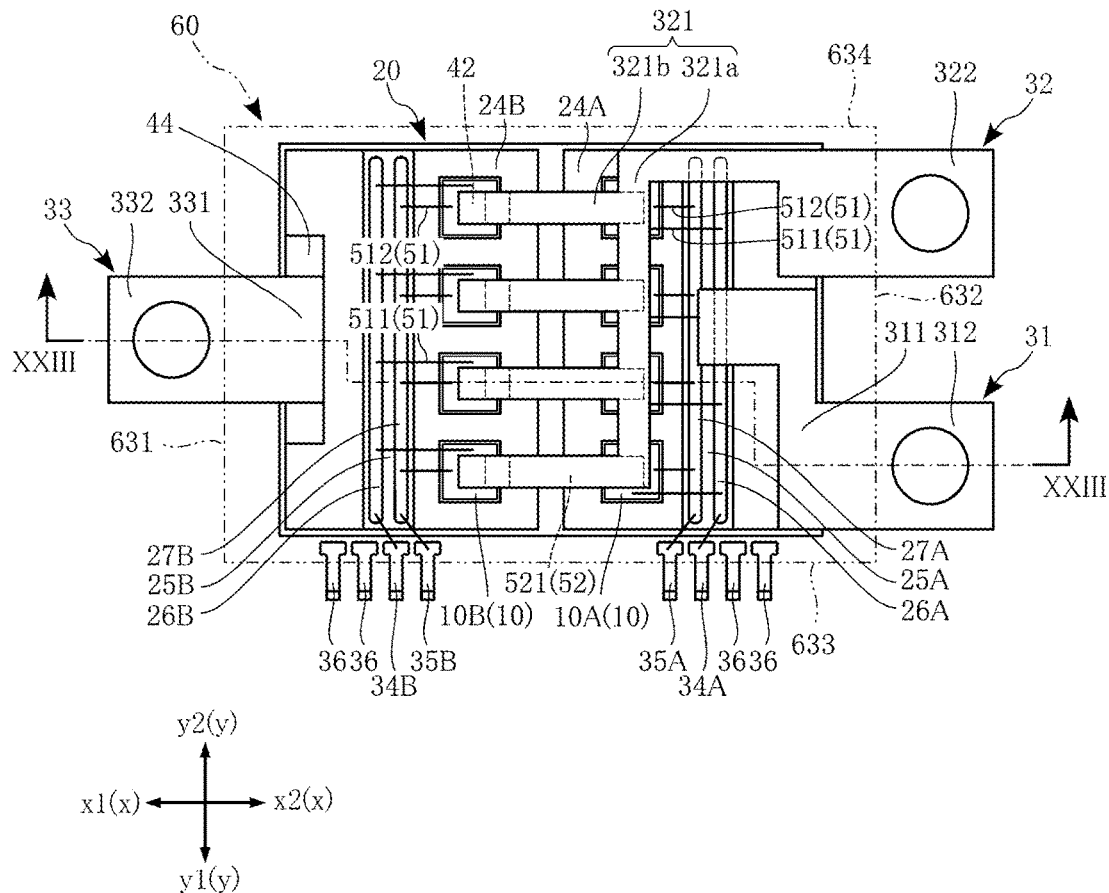
FIG. 21 is a plan view of a semiconductor device according to a third embodiment.
Figure 22:
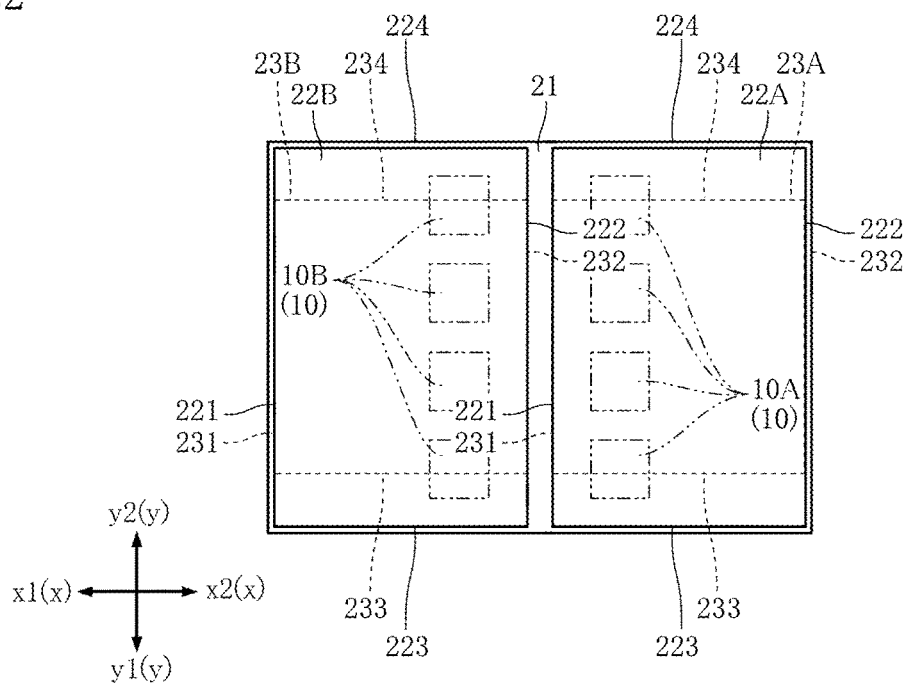
FIG. 22 is a plan view showing some parts extracted from the plan view of FIG. 21.
Figure 23:
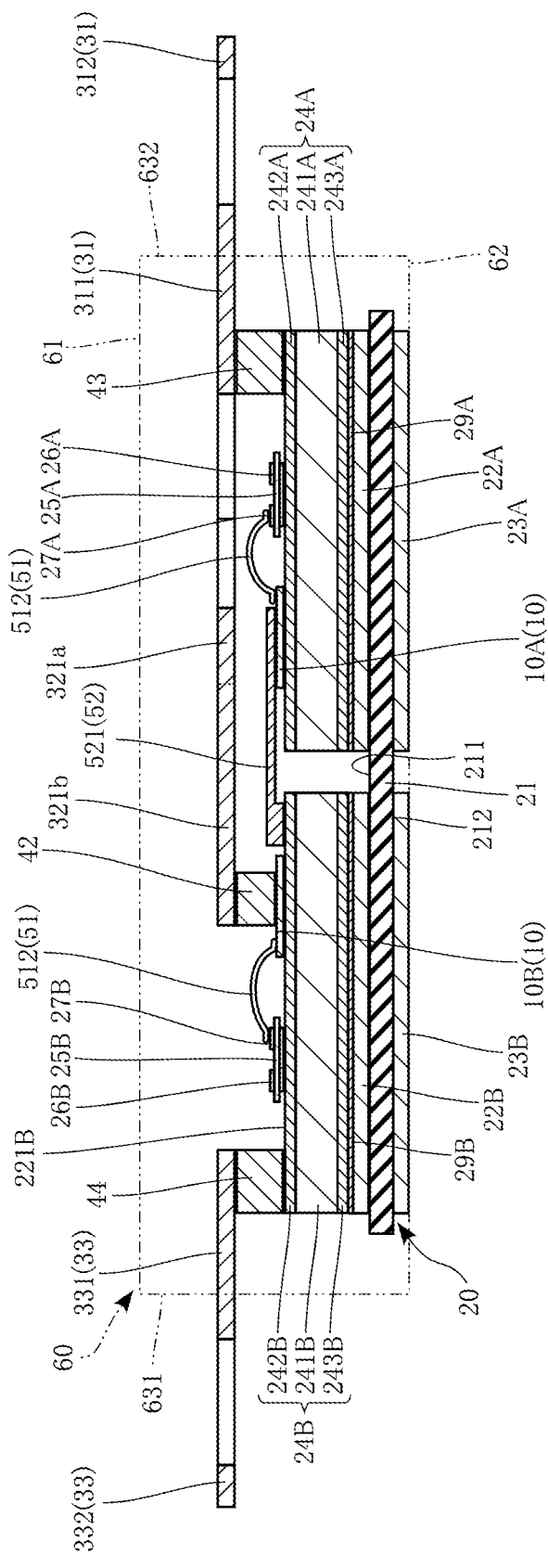
FIG. 23 is a sectional view taken along line XXIII-XXIII in FIG. 21.

FIGS. 21 to 23 show a semiconductor device A3 according to a third embodiment. FIG. 21 is a plan view of the semiconductor device A3, with the sealing member 60 indicated by imaginary lines (two-dot chain lines). FIG. 22 a plan view showing some parts extracted from the plan view of FIG. 21. FIG. 23 is a sectional view taken along line XXIII-XXIII in FIG. 21.

In the semiconductor device A3, unlike the semiconductor device A1, the semiconductor elements 10A and semiconductor elements 10B are disposed to overlap with each other as viewed in the x direction. As shown in FIG. 22, in the semiconductor device A3, as with the semiconductor device A1, the edge 233 of the reverse-surface metal layer 23A overlaps with one of the semiconductor elements 10A that is offset furthest in the y1 direction in plan view, and the edge 234 of the reverse-surface metal layer 23A overlaps with one of the semiconductor elements 10A that is offset furthest in the y2 direction. Also, as shown in FIG. 22, the edge 233 of the reverse-surface metal layer 23B overlaps with one of the semiconductor elements 10B that is offset furthest in the y1 direction in plan view, and the edge 234 of the reverse-surface metal layer 23B overlaps with one of the semiconductor elements 10B that is offset furthest in the y2 direction.

Moreover, as shown in FIGS. 21 and 23, the semiconductor device A3 differs from the semiconductor device A1 in configuration of the two input terminals 31, 32 and the output terminal 33. For example, as shown in FIGS. 21 and 23, the two input terminals 31 and 32 of the semiconductor device A3 are not disposed to overlap with each other in the z direction as are in the semiconductor device A1, but disposed to overlap with each other as viewed in the y direction.

As shown in FIGS. 21 and 23, the pad portion 311 of the input terminal 31 of the semiconductor device A3 is conductively bonded to the conductive member 24A via a conductive block member 43. The pad portion 331 is bonded to the block member 43, and the block member 43 is bonded to the conductive member 24A. The bonding between the pad portion 331 and the block member 43 and between the block member 43 and the conductive member 24A may be made by laser bonding, ultrasonic bonding or by using a conductive bonding material. The material for the block member 43 is not limited and may be Cu, a Cu alloy, a CuMO composite material or a CIC composite material, for example.

In the semiconductor device A3, as with the semiconductor device A2, the extensions 321b of the pad portion 321 of the input terminal 32 are extended to overlap with the semiconductor elements 10B in plan view, as shown in FIGS. 21 and 23. Also, as with the semiconductor device A2, the end (on the x1 side) of each extension 321b is electrically connected to a corresponding semiconductor element 10B (first electrode 111) via a block member 42.

As shown in FIGS. 21 and 23, the pad portion 331 of the output terminal 33 of the semiconductor device A3 is conductively bonded at a part thereof to the conductive member 24B via a conductive block member 44. The pad portion 331 is bonded to the block member 44, and the block member 44 is bonded to the conductive member 24B. The bonding between the pad portion 331 and the block member 44 and between the block member 44 and the conductive member 24B may be made by laser bonding, ultrasonic bonding or by using a conductive bonding material. The material for the block member 44 is not limited and may be Cu, a Cu alloy, a CuMO composite material or a CIC composite material, for example.

The configurations of other parts of the semiconductor device A3 are the same as those of the semiconductor device A1.

In the semiconductor device A3 again, as with the semiconductor device A1, the dimensions of the reverse-surface metal layers 23A and 23B in the y direction are smaller than those of the obverse-surface metal layers 22A and 22B. Thus, as with the semiconductor device A1, the semiconductor device A3 can reduce the warpage of the supporting substrate 20.

Figure 24:
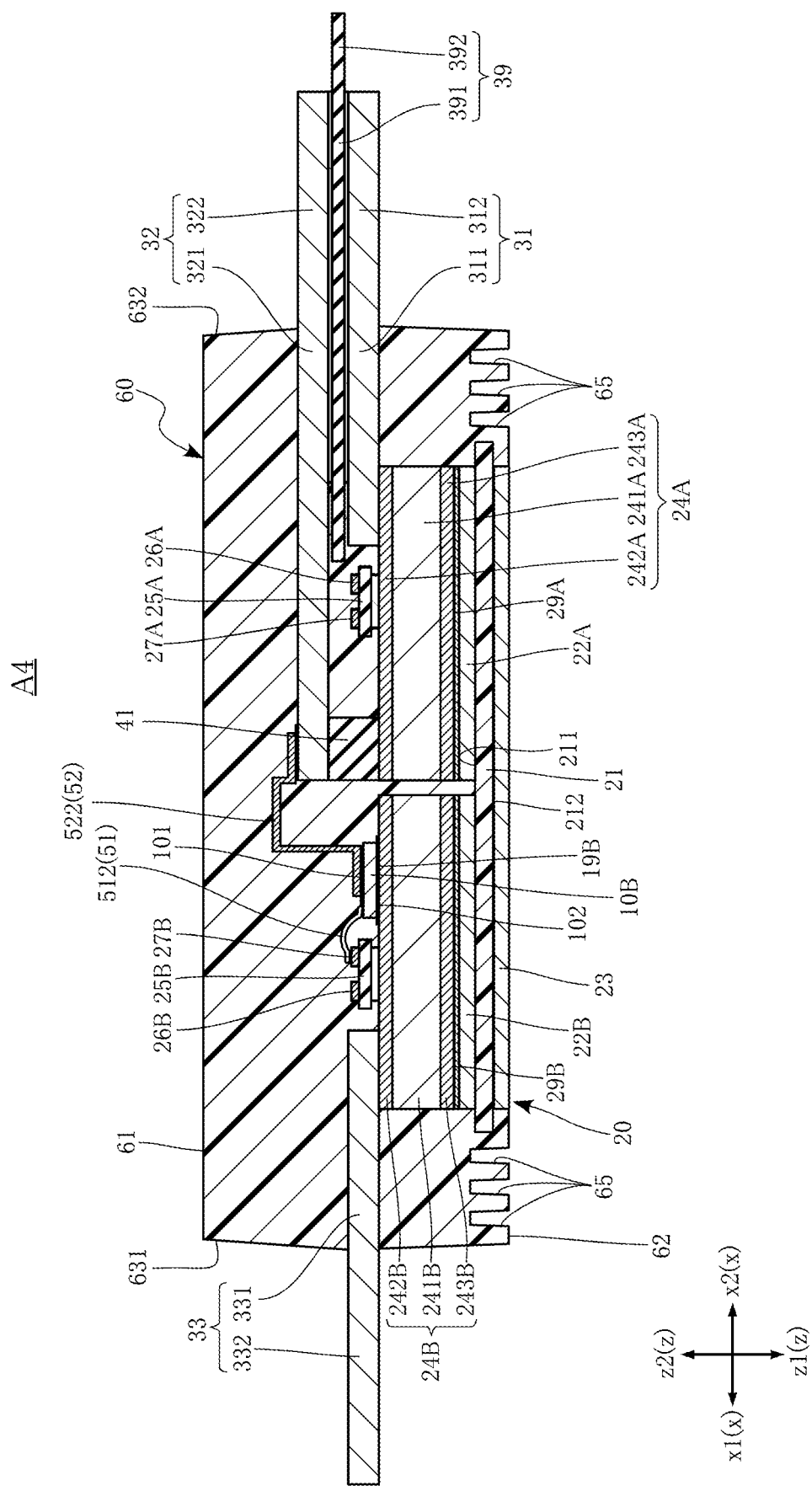
FIG. 24 is a sectional view of a semiconductor device according to a fourth embodiment.
Figure 25:
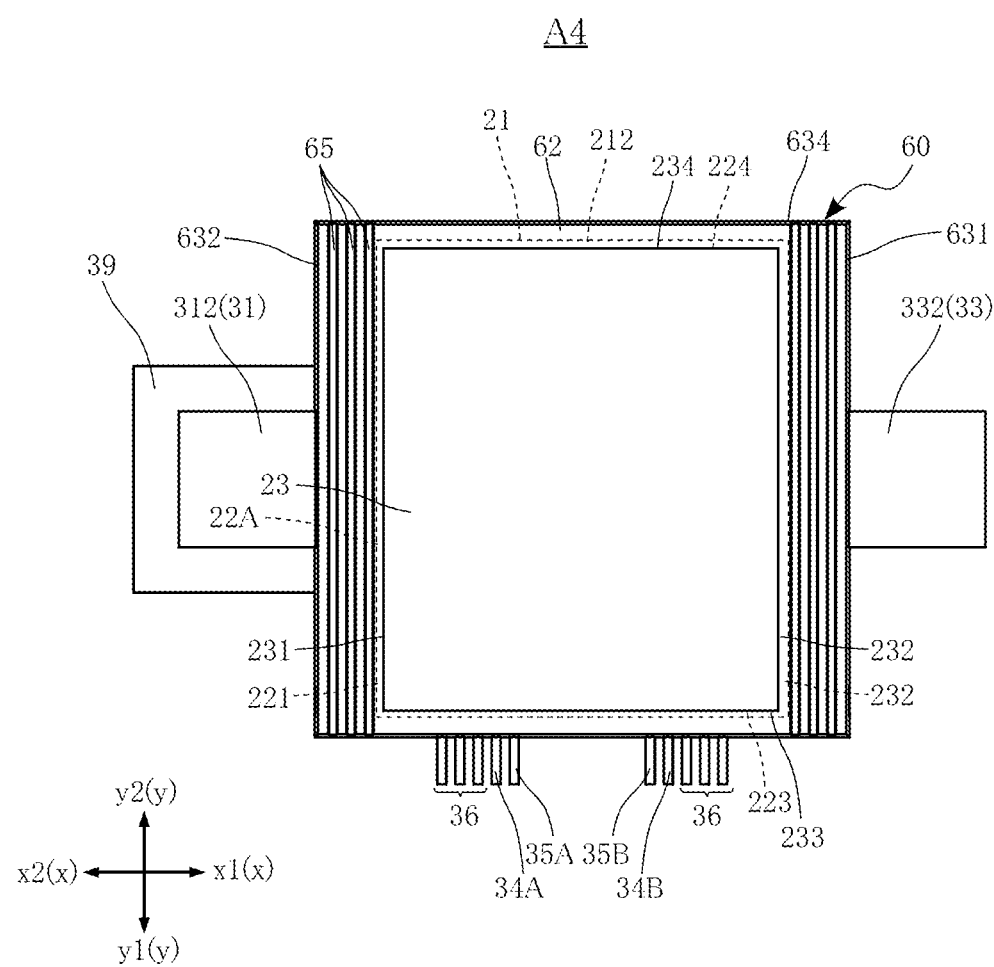
FIG. 25 is a bottom view of the semiconductor device according to the fourth embodiment.

FIGS. 24 and 25 show a semiconductor device A4 according to a fourth embodiment. FIG. 24 is a sectional view of the semiconductor device A4 and corresponds to the section of the first embodiment shown in FIG. 11. FIG. 25 is a bottom view of the semiconductor device A4.

The semiconductor device A4 differs from the semiconductor device A1 mainly in configuration of the supporting substrate 20.

In the semiconductor device A4, the insulating substrate 21 of the supporting substrate 20 is made of, for example, boron nitride (BN) resin, rather than a ceramic material. BN resin is a resin material obtained by mixing BN with a filler and has an anisotropic coefficient of linear expansion, as with graphite. The insulating substrate 21 is arranged such that the direction in which the coefficient of linear expansion is relatively large is along the y direction. In the insulating substrate 21, the coefficient of linear expansion is about 2 ppm/K in the x direction, about 27 ppm/K in the y direction and about 2 ppm/K in the z direction.

The supporting substrate 20 of the semiconductor device A4 does not include a pair of reverse-surface metal layers 23A and 23B but includes a single reverse-surface metal layer 23. As shown in FIG. 25, the reverse-surface metal layer 23 is rectangular in plan view. Each of the obverse-surface metal layers 22A and 22B overlaps with the reverse-surface metal layer 23 in plan view. The dimension of the reverse-surface metal layer 23 in the y direction is approximately the same as the dimension of each of the obverse-surface metal layers 22A and 22B in the y direction and the dimension of the insulating substrate 21 in the y direction. The dimension of the insulating substrate 21, each of the obverse-surface metal layers 22A and 22B, and the reverse-surface metal layer 23 in the z direction is about 0.1 mm.

In the semiconductor device A4, the insulating substrate 21 is made of BN resin having an anisotropic coefficient of linear expansion. The insulating substrate 21 is arranged such that the direction in which the coefficient of linear expansion is relatively large is along the y direction. That is, the direction in which the coefficient of linear expansion is relatively large in the insulating substrate 21 generally corresponds to the direction in which the coefficient of linear expansion is relatively large in each of the conductive layers 241A and 241B. Studies by the inventor of the present application revealed that such an arrangement reduces the warpage of the supporting substrate 20. The semiconductor device A4 can reduce the warpage of the supporting substrate 20 without dividing the reverse-surface metal layer 23 into two parts or making the dimension in the y direction small.

Although the fourth embodiment describes an example in which the dimension of the reverse-surface metal layer 23 in the y direction is approximately the same as the dimension of each of the obverse-surface metal layers 22A and 22B in the y direction, the dimension of the reverse-surface metal layer 23 in the y direction may be made smaller than the dimension of each of the obverse-surface metal layers 22A and 22B in the y direction. Moreover, although the semiconductor device A4 describes an example in which the supporting substrate 20 has a single reverse-surface metal layer 23, the supporting substrate 20 may have two reverse-surface metal layers 23A and 23B, as with the semiconductor device A1. In such a case, the dimension of each of the reverse-surface metal layers 23A and 23B in the y direction may be approximately the same as the dimension of each of the obverse-surface metal layers 22A and 22B in the y direction or may be smaller than the dimension of each of the obverse-surface metal layers 22A and 22B in the y direction.

Figure 26:
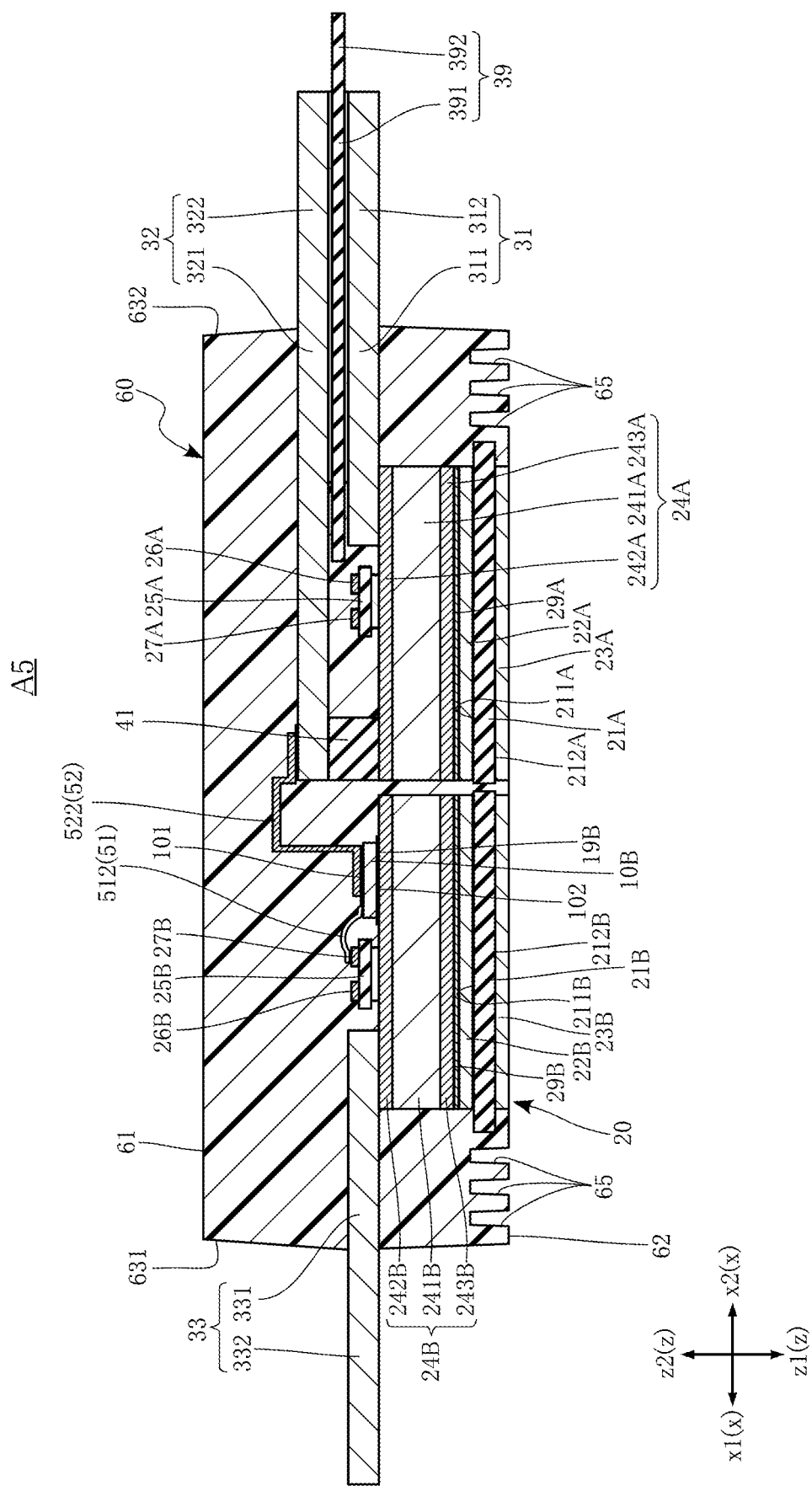
FIG. 26 is a sectional view of a semiconductor device according to a fifth embodiment.
Figure 27:
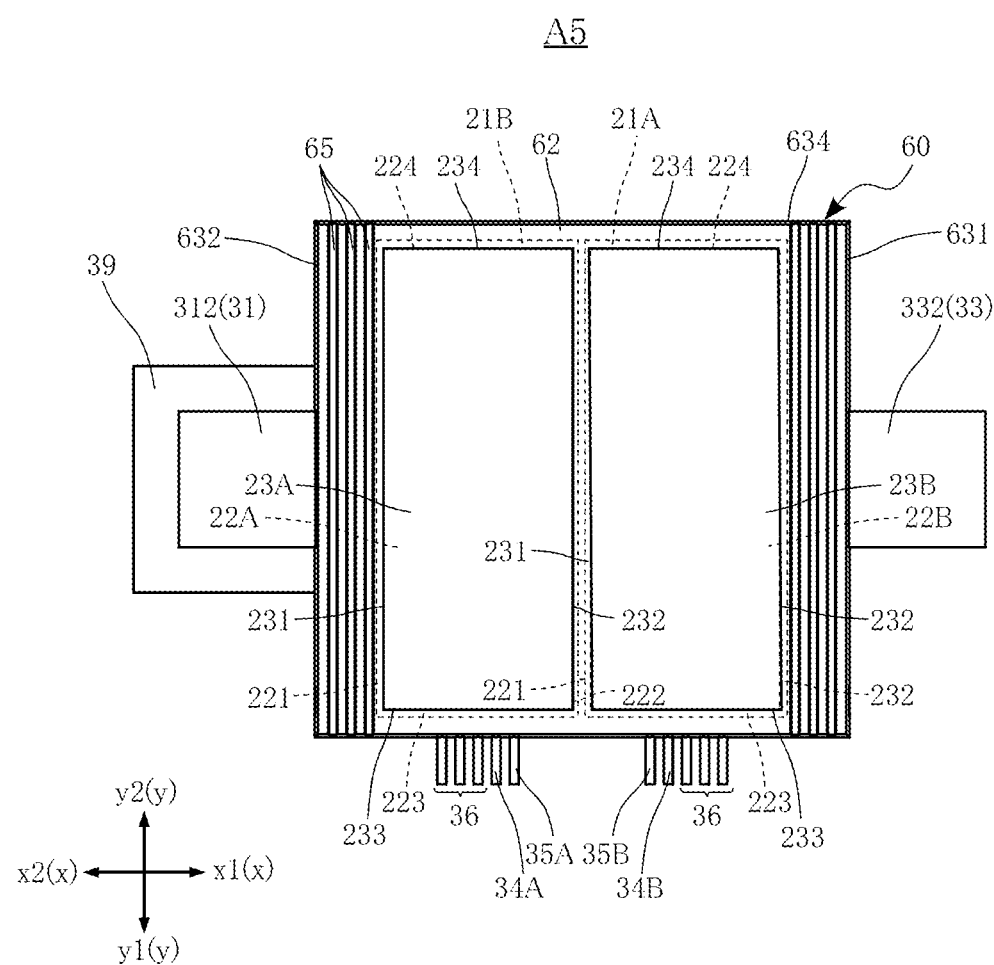
FIG. 27 is a bottom view of the semiconductor device according to a fifth embodiment.

FIGS. 26 and 27 show a semiconductor device A5 according to a fifth embodiment. FIG. 26 is a sectional view of the semiconductor device A5 and corresponds to the section of the first embodiment shown in FIG. 11. FIG. 27 is a bottom view of the semiconductor device A5.

As shown in FIGS. 26 and 27, the semiconductor device A5 includes a pair of insulating substrates 21A and 21B that are spaced apart from each other, instead of the single insulating substrate 21 in the semiconductor device A1. That is, the semiconductor device A5 has a configuration in which the insulating substrate 21 is divided into two parts. The insulating substrates 21A and 21B are spaced apart from each other and arranged side by side in the x direction. Each of the insulating substrates 21A and 21B is rectangular in plan view. The insulating substrates 21A and 21B may be made of a ceramic material or may be made of an insulating resin having a Young's modulus of about 50 GPa or less. Alternatively, the insulating substrates 21A and 21B may be made of BN resin. In such a case, each of the insulating substrate 21A and 21B is arranged such that the direction in which the coefficient of linear expansion is relatively large is along the y direction.

As shown in FIG. 26, the insulating substrate 21A has an obverse surface 211A and a reverse surface 212A. The obverse surface 211A and the reverse surface 212A are spaced apart from each other in the z direction. The obverse surface 211A faces in the z2 direction, and the reverse surface 212A faces in the z1 direction.

The obverse-surface metal layer 22A is disposed on the obverse surface 211A, and the reverse-surface metal layer 23A is disposed on the reverse surface 212A. The insulating substrate 21A, the obverse-surface metal layer 22A and the reverse-surface metal layer 23A overlap with each other in plan view. In particular, the obverse-surface metal layer 22A and the reverse-surface metal layer 23A have the approximately same dimension in the y direction, and the obverse-surface metal layer 22A and the reverse-surface metal layer 23A overlap with each other generally entirely in plan view. That is, in plan view, the edges 221 to 224 of the obverse-surface metal layer 22A overlap with the edges 231 to 234 of the reverse-surface metal layer 23A, respectively.

As shown in FIG. 26, the insulating substrate 21B has an obverse surface 211B and a reverse surface 212B. The obverse surface 211B and the reverse surface 212B are spaced apart from each other in the z direction. The obverse surface 211B faces in the z2 direction, and the reverse surface 212B faces in the z1 direction.

The obverse-surface metal layer 22B is disposed on the obverse surface 211B, and the reverse-surface metal layer 23B is disposed on the reverse surface 212B. The insulating substrate 21B, the obverse-surface metal layer 22B and the reverse-surface metal layer 23B overlap with each other in plan view. In particular, the obverse-surface metal layer 22B and the reverse-surface metal layer 23B have the approximately same dimension in the y direction, and the obverse-surface metal layer 22B and the reverse-surface metal layer 23B overlap with each other generally entirely in plan view. That is, in plan view, the edges 221 to 224 of the obverse-surface metal layer 22B overlap with the edges 231 to 234 of the reverse-surface metal layer 23B, respectively.

In this way, in the semiconductor device A5, two mutually separated insulating substrates 21A and 21B are provided, and the conductive layer 241A is disposed on the insulating substrate 21A, while the conductive layer 241B is disposed on the insulating substrate 21B. That is, unlike the semiconductor device A1, the semiconductor device A5 does not have two conductive layers 241A and 241B on a single insulating substrate 21. With such a configuration, during the above-described heat cycle, the thermal stress applied to each of the insulating substrates 21A and 21B is smaller than that applied to the single insulating substrate 21. Thus, the warpage of each of the insulating substrates 21A and 21b is reduced, so that the semiconductor device A5 can achieve a reduced warpage of the supporting substrate 20. When the insulating substrates 21A and 21B are made of an insulating resin having a Young's modulus of about 50 GPa or less, the softness of the insulating substrates 21A and 21B alleviates the thermal stress on the insulating substrates 21A and 21B, which is preferable to reduce the warpage of the supporting substrate 20.

Although the fifth embodiment describes an example in which the dimensions of the reverse-surface metal layers 23A and 23B in the y direction are approximately the same as the dimensions of the obverse-surface metal layers 22A and 22B in the y direction, the dimensions of the reverse-surface metal layers 23A and 23B in the y direction may be made smaller than the dimensions of the obverse-surface metal layers 22A and 22B in the y direction.

The semiconductor device according to the present disclosure is not limited to the foregoing embodiments. The specific configuration of each part of the semiconductor device according to the present disclosure may be varied in design in many ways. The present disclosure includes the semiconductor device defined in the following clauses.

Clause 1.

A semiconductor device comprising:
  an insulating substrate having a first obverse surface and a first reverse surface spaced apart from each other in a first direction;
  a first obverse-surface metal layer and a second obverse-surface metal layer disposed on the first obverse surface and spaced apart from each other;
  a first reverse-surface metal layer and a second reverse-surface metal layer disposed on the first reverse surface and spaced apart from each other;
  a first conductive layer disposed on the first obverse-surface metal layer;

a second conductive layer disposed on the second obverse-surface metal layer;

a first semiconductor element disposed on the first conductive layer and electrically connected to the first conductive layer; and a second semiconductor element disposed on the second conductive layer and electrically connected to the second conductive layer, wherein the first obverse-surface metal layer and the first reverse-surface metal layer overlap with each other as viewed in the first direction, the second obverse-surface metal layer and the second reverse-surface metal layer overlap with each other as viewed in the first direction, the first obverse-surface metal layer and the second obverse-surface metal layer are arranged side by side in a second direction perpendicular to the first direction, each of the first conductive layer and the second conductive layer has an anisotropic coefficient of linear expansion and is arranged such that a direction in which the coefficient of linear expansion is relatively large is along a third direction perpendicular to the first direction and the second direction, and dimensions of the first reverse-surface metal layer and the second reverse-surface metal layer in the third direction are smaller than dimensions of the first obverse-surface metal layer and the second obverse-surface metal layer in the third direction, respectively.

Clause 2.

The semiconductor device according to clause 1, wherein each of the first obverse-surface metal layer, the second obverse-surface metal layer, the first reverse-surface metal layer and the second reverse-surface metal layer has a pair of first edges each extending in the third direction as viewed in the first direction, the pair of first edges of the first obverse-surface metal layer and the pair of first edges of the first reverse-surface metal layer overlap with each other as viewed in the first direction, and the pair of first edges of the second obverse-surface metal layer and the pair of first edges of the second reverse-surface metal layer overlap with each other as viewed in the first direction.

Clause 3.

The semiconductor device according to clause 2, wherein each of the first reverse-surface metal layer and the second reverse-surface metal layer has a pair of second edges each extending in the second direction as viewed in the first direction, the pair of second edges of the first reverse-surface metal layer overlap with the first obverse-surface metal layer as viewed in the first direction, and the pair of second edges of the second reverse-surface metal layer overlap with the second obverse-surface metal layer as viewed in the first direction.

Clause 4.

The semiconductor device according to clause 3, further comprising:

an additional first semiconductor element arranged side by side with the first semiconductor element in the third direction; and an additional second semiconductor element arranged side by side with the second semiconductor element in the third direction, wherein the additional first semiconductor element is disposed on the first conductive layer and overlaps with one of the second edges of the first reverse-surface metal layer, and the additional second semiconductor element is disposed on the second conductive layer and overlaps with one of the second edges of the second reverse-surface metal layer.

Clause 5.

The semiconductor device according to any one of clauses 1 to 4, wherein each of the first conductive layer and the second conductive layer is formed with a surface metal layer on each of opposite surfaces thereof that are spaced apart from each other in the first direction.

Clause 6.

The semiconductor device according to clause 5, wherein the surface metal layer has a dimension in the first direction that is smaller than respective dimensions of the first conductive layer and the second conductive layer in the first direction.

Clause 7.

The semiconductor device according to any one of clauses 1 to 6, further comprising:

a first conductive bonding layer interposed between the first conductive layer and the first obverse-surface metal layer in the first direction; and a second conductive bonding layer interposed between the second conductive layer and the second obverse-surface metal layer in the first direction.

Clause 8.

The semiconductor device according to any one of clauses 1 to 7, further comprising a sealing member covering the insulating substrate, the first obverse-surface metal layer, the second obverse-surface metal layer, the first conductive layer, the second conductive layer, the first semiconductor element and the second semiconductor element.

Clause 9.

The semiconductor device according to clause 8, further comprising a connecting member covered with the sealing member, wherein the first semiconductor element includes a first reverse-surface electrode electrically connected to the first conductive layer and a first obverse-surface electrode spaced apart from the first reverse-surface electrode in the first direction, and the first obverse-surface electrode and the second conductive layer are electrically connected to each other with the connecting member.

Clause 10.

The semiconductor device according to clause 9, wherein the second semiconductor element includes a second reverse-surface electrode electrically connected to the second conductive layer and a second obverse-surface electrode spaced apart from the second reverse-surface electrode in the first direction.

Clause 11.

The semiconductor device according to clause 10, further comprising:

a first input terminal electrically connected to the first reverse-surface electrode via the first conductive layer;

a second input terminal electrically connected to the second obverse-surface electrode; and an output terminal electrically connected to the second conductive layer, wherein each of the first input terminal, the second input terminal and the output terminal includes a part exposed from the sealing resin.

Clause 12.

The semiconductor device according to any one of clauses 1 to 11, wherein the first conductive layer and the second conductive layer are made of graphite.

Clause 13.

The semiconductor device according to any one of clauses 1 to 12, wherein the insulating substrate is made of a ceramic material.

Clause 14.

The semiconductor device according to any one of clauses 1 to 12, wherein the insulating substrate is made of a resin material having an anisotropic coefficient of linear expansion, and a direction in which the coefficient of linear expansion is relatively large in the insulating substrate generally corresponds to the direction in which the coefficient of linear expansion is relatively large in each of the first conductive layer and the second conductive layer.

Clause 15.

A semiconductor device comprising:

an insulating substrate having a first obverse surface and a first reverse surface spaced apart from each other in a first direction;

a first obverse-surface metal layer and a second obverse-surface metal layer disposed on the first obverse surface and spaced apart from each other;

a reverse-surface metal layer disposed on the first reverse surface;

a first conductive layer disposed on the first obverse-surface metal layer;

a second conductive layer disposed on the second obverse-surface metal layer;

a first semiconductor element disposed on the first conductive layer and electrically connected to the first conductive layer; and a second semiconductor element disposed on the second conductive layer and electrically connected to the second conductive layer, wherein the first obverse-surface metal layer and the second obverse-surface metal layer are arranged side by side in a second direction perpendicular to the first direction and each overlapping with the reverse-surface metal layer as viewed in the first direction, each of the first conductive layer and the second conductive layer has an anisotropic coefficient of linear expansion and is arranged such that a direction in which the coefficient of linear expansion is relatively large is along a third direction perpendicular to the first direction and the second direction, and the insulating substrate is made of a resin material having an anisotropic coefficient of linear expansion and is arranged such that a direction in which the coefficient of linear expansion is relatively large is along the third direction.

Clause 16.

The semiconductor device according to clause 15, wherein the insulating substrate has a dimension in the first direction that is approximately the same as respective dimensions of the first obverse-surface metal layer, the second obverse-surface metal layer and the reverse-surface metal layer in the first direction.

Clause 17.

The semiconductor device according to any one of clauses 14 to 16, wherein the resin material forming the insulating substrate has a Young's modulus of 50 GPa or less.

Clause 18.

A semiconductor device comprising:

a first insulating substrate having a first obverse surface and a first reverse surface spaced apart from each other in a first direction;

a second insulating substrate having a second obverse surface and a second reverse surface spaced apart from each other in the first direction;

a first obverse-surface metal layer disposed on the first obverse surface;

a second obverse-surface metal layer disposed on the second obverse surface;

a first reverse-surface metal layer disposed on the first reverse surface;

a second reverse-surface metal layer disposed on the second reverse surface;

a first conductive layer disposed on the first obverse-surface metal layer;

a second conductive layer disposed on the second obverse-surface metal layer;

a first semiconductor element disposed on the first conductive layer and electrically connected to the first conductive layer; and a second semiconductor element disposed on the second conductive layer and electrically connected to the second conductive layer, wherein the first insulating substrate and the second insulating substrate are arranged side by side and spaced apart from each other in a second direction perpendicular to the first direction, the first obverse-surface metal layer and the first reverse-surface metal layer overlap with each other as viewed in the first direction, the second obverse-surface metal layer and the second reverse-surface metal layer overlap with each other as viewed in the first direction, each of the first conductive layer and the second conductive layer has an anisotropic coefficient of linear expansion and is arranged such that a direction in which the coefficient of linear expansion is relatively large is along a third direction perpendicular to the first direction and the second direction, and each of the first insulating substrate and the second insulating substrate is made of a resin material having a Young's modulus of 50 GPa or less.

LIST OF REFERENCE CHARACTERS

A1 to A5: Semiconductor Device
10, 10A, 10B: Semiconductor Element
101: Element Obverse Surface
102: Element Reverse Surface
11: Obverse-surface Electrode
111: First Electrode
112: Second Electrode
12: Reverse-surface electrode
13: Insulating Film
19A, 19B: Conductive Bonding Material
20: Supporting substrate
21, 21A, 21B: Insulating Substrate
211, 211A, 211B: Obverse Surface
212, 212A, 212B: Reverse Surface
22A, 22B: Obverse-surface Metal Layer
221 to 224: Edge
23, 23A, 23B: Reverse-surface Metal Layer
231 to 234: Edge
24A, 24B: Conductive Member
241A, 241B: Conductive Layer
242A, 242B: Metal layer 243A, 243B: Metal Layer
25A, 25B: Insulating Layer
26A, 26B: Gate Layer
27A, 27B: Detection Layer
29A, 29B: Conductive Bonding Layer
31: Input Terminal
311: Pad Portion
312: Terminal Portion
32: Input Terminal
321: Pad Portion
321a: Connecting Part
321b: Extension
322: Terminal Portion
33: Output Terminal
331: Pad Portion
332: Terminal Portion
34A, 34B: Gate Terminal
341: Pad Portion
342: Terminal Portion
35A, 35B: Detection Terminal
351: Pad Portion
352: Terminal Portion
36: Dummy Terminal
361: Pad Portion
362: Terminal Portion
37A, 37B: Side Terminal
39: Insulating Plate 391: Intervening Portion
392: Extension
41: Base Part
42, 43, 44: Block Member
51: Cord-like Connecting Member
511: Gate Wire
512: Detection Wire
513: First Connecting Wire
514: Second Connecting Wire
52: Plate-like Connecting Member
521: First Lead
522: Second Lead
60: Sealing Member
61: Resin Obverse Surface
62: Resin Reverse Surface
631 to 634: Resin Side Surface
65: Groove

The invention claimed is:

1. A semiconductor device comprising:
an insulating substrate having a first obverse surface and a first reverse surface spaced apart from each other in a first direction;
a first obverse-surface metal layer and a second obverse-surface metal layer disposed on the first obverse surface and spaced apart from each other;
a first reverse-surface metal layer and a second reverse-surface metal layer disposed on the first reverse surface and spaced apart from each other;
a first conductive layer disposed on the first obverse-surface metal layer;
a second conductive layer disposed on the second obverse-surface metal layer;
a first semiconductor element disposed on the first conductive layer and electrically connected to the first conductive layer; and
a second semiconductor element disposed on the second conductive layer and electrically connected to the second conductive layer,
wherein the first obverse-surface metal layer and the first reverse-surface metal layer overlap with each other as viewed in the first direction,
the second obverse-surface metal layer and the second reverse-surface metal layer overlap with each other as viewed in the first direction,
the first obverse-surface metal layer and the second obverse-surface metal layer are arranged side by side in a second direction perpendicular to the first direction,
each of the first conductive layer and the second conductive layer has an anisotropic coefficient of linear expansion and is arranged such that a direction in which the coefficient of linear expansion is relatively large is along a third direction perpendicular to the first direction and the second direction, and
dimensions of the first reverse-surface metal layer and the second reverse-surface metal layer in the third direction are smaller than dimensions of the first obverse-surface metal layer and the second obverse-surface metal layer in the third direction, respectively.

2. The semiconductor device according to claim 1, wherein each of the first obverse-surface metal layer, the second obverse-surface metal layer, the first reverse-surface metal layer and the second reverse-surface metal layer has a pair of first edges each extending in the third direction as viewed in the first direction,
the pair of first edges of the first obverse-surface metal layer and the pair of first edges of the first reverse-surface metal layer overlap with each other as viewed in the first direction, and
the pair of first edges of the second obverse-surface metal layer and the pair of first edges of the second reverse-surface metal layer overlap with each other as viewed in the first direction.

3. The semiconductor device according to claim 2, wherein each of the first reverse-surface metal layer and the second reverse-surface metal layer has a pair of second edges each extending in the second direction as viewed in the first direction,
the pair of second edges of the first reverse-surface metal layer overlap with the first obverse-surface metal layer as viewed in the first direction, and
the pair of second edges of the second reverse-surface metal layer overlap with the second obverse-surface metal layer as viewed in the first direction.

4. The semiconductor device according to claim 3, further comprising:
an additional first semiconductor element arranged side by side with the first semiconductor element in the third direction; and
an additional second semiconductor element arranged side by side with the second semiconductor element in the third direction,
wherein the additional first semiconductor element is disposed on the first conductive layer and overlaps with one of the second edges of the first reverse-surface metal layer, and
the additional second semiconductor element is disposed on the second conductive layer and overlaps with one of the second edges of the second reverse-surface metal layer.

5. The semiconductor device according to claim 1, wherein each of the first conductive layer and the second conductive layer is formed with a surface metal layer on each of opposite surfaces thereof that are spaced apart from each other in the first direction.

6. The semiconductor device according to claim 5, wherein the surface metal layer has a dimension in the first direction that is smaller than respective dimensions of the first conductive layer and the second conductive layer in the first direction.

7. The semiconductor device according to claim 1, further comprising:
   a first conductive bonding layer interposed between the first conductive layer and the first obverse-surface metal layer in the first direction; and
   a second conductive bonding layer interposed between the second conductive layer and the second obverse-surface metal layer in the first direction.

8. The semiconductor device according to claim 1, further comprising a sealing member covering the insulating substrate, the first obverse-surface metal layer, the second obverse-surface metal layer, the first conductive layer, the second conductive layer, the first semiconductor element and the second semiconductor element.

9. The semiconductor device according to claim 8, further comprising a connecting member covered with the sealing member,
   wherein the first semiconductor element includes a first reverse-surface electrode electrically connected to the first conductive layer and a first obverse-surface electrode spaced apart from the first reverse-surface electrode in the first direction, and
   the first obverse-surface electrode and the second conductive layer are electrically connected to each other with the connecting member.

10. The semiconductor device according to claim 9, wherein the second semiconductor element includes a second reverse-surface electrode electrically connected to the second conductive layer and a second obverse-surface electrode spaced apart from the second reverse-surface electrode in the first direction.

11. The semiconductor device according to claim 10, further comprising:
    a first input terminal electrically connected to the first reverse-surface electrode via the first conductive layer;
    a second input terminal electrically connected to the second obverse-surface electrode; and
    an output terminal electrically connected to the second conductive layer,
    wherein each of the first input terminal, the second input terminal and the output terminal includes a part exposed from the sealing resin.

12. The semiconductor device according to claim 1, wherein the first conductive layer and the second conductive layer are made of graphite.

13. The semiconductor device according to claim 1, wherein the insulating substrate is made of a ceramic material.

14. The semiconductor device according to claim 1, wherein the insulating substrate is made of a resin material having an anisotropic coefficient of linear expansion, and
    a direction in which the coefficient of linear expansion is relatively large in the insulating substrate generally corresponds to the direction in which the coefficient of linear expansion is relatively large in each of the first conductive layer and the second conductive layer.

15. A semiconductor device comprising:
    an insulating substrate having a first obverse surface and a first reverse surface spaced apart from each other in a first direction;
    a first obverse-surface metal layer and a second obverse-surface metal layer disposed on the first obverse surface and spaced apart from each other;
    a reverse-surface metal layer disposed on the first reverse surface;
    a first conductive layer disposed on the first obverse-surface metal layer;
    a second conductive layer disposed on the second obverse-surface metal layer;
    a first semiconductor element disposed on the first conductive layer and electrically connected to the first conductive layer; and
    a second semiconductor element disposed on the second conductive layer and electrically connected to the second conductive layer,
    wherein the first obverse-surface metal layer and the second obverse-surface metal layer are arranged side by side in a second direction perpendicular to the first direction and each overlapping with the reverse-surface metal layer as viewed in the first direction,
    each of the first conductive layer and the second conductive layer has an anisotropic coefficient of linear expansion and is arranged such that a direction in which the coefficient of linear expansion is relatively large is along a third direction perpendicular to the first direction and the second direction, and
    the insulating substrate is made of a resin material having an anisotropic coefficient of linear expansion and is arranged such that a direction in which the coefficient of linear expansion is relatively large is along the third direction.

16. The semiconductor device according to claim 15, wherein the insulating substrate has a dimension in the first direction that is approximately the same as respective dimensions of the first obverse-surface metal layer, the second obverse-surface metal layer and the reverse-surface metal layer in the first direction.

17. The semiconductor device according to claim 14, wherein the resin material forming the insulating substrate has a Young's modulus of 50 GPa or less.

18. A semiconductor device comprising:
    a first insulating substrate having a first obverse surface and a first reverse surface spaced apart from each other in a first direction;
    a second insulating substrate having a second obverse surface and a second reverse surface spaced apart from each other in the first direction;
    a first obverse-surface metal layer disposed on the first obverse surface;
    a second obverse-surface metal layer disposed on the second obverse surface;
    a first reverse-surface metal layer disposed on the first reverse surface;
    a second reverse-surface metal layer disposed on the second reverse surface;
    a first conductive layer disposed on the first obverse-surface metal layer;
    a second conductive layer disposed on the second obverse-surface metal layer;
    a first semiconductor element disposed on the first conductive layer and electrically connected to the first conductive layer; and
    a second semiconductor element disposed on the second conductive layer and electrically connected to the second conductive layer,
    wherein the first insulating substrate and the second insulating substrate are arranged side by side and spaced apart from each other in a second direction perpendicular to the first direction, the first obverse-surface metal layer and the first reverse-surface metal layer overlap with each other as viewed in the first direction, the second obverse-surface metal layer and the second reverse-surface metal layer overlap with each other as viewed in the first direction, each of the first conductive layer and the second conductive layer has an anisotropic coefficient of linear expansion and is arranged such that a direction in which the coefficient of linear expansion is relatively large is along a third direction perpendicular to the first direction and the second direction, and each of the first insulating substrate and the second insulating substrate is made of a resin material having a Young's modulus of 50 GPa or less.

* * * * *